(12) United States Patent
Cheng et al.

(10) Patent No.: US 9,716,108 B2
(45) Date of Patent: Jul. 25, 2017

(54) THIN FILM TRANSISTOR AND FABRICATION METHOD THEREOF, ARRAY SUBSTRATE, AND DISPLAY DEVICE

(71) Applicant: BOE TECHNOLOGY GROUP CO., LTD., Beijing (CN)

(72) Inventors: Jun Cheng, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 78 days.

(21) Appl. No.: 14/106,645

(22) Filed: Dec. 13, 2013

(65) Prior Publication Data
US 2014/0167036 A1    Jun. 19, 2014

(30) Foreign Application Priority Data

Dec. 14, 2012    (CN) .......................... 2012 1 0546613

(51) Int. Cl.
*H01L 29/66*    (2006.01)
*H01L 27/12*    (2006.01)
(Continued)

(52) U.S. Cl.
CPC .... *H01L 27/1225* (2013.01); *H01L 29/66969* (2013.01); *H01L 29/7869* (2013.01); *H01L 29/78618* (2013.01); *H01L 29/78621* (2013.01)

(58) Field of Classification Search
CPC ........... H01L 27/1225; H01L 29/66969; H01L 29/78618; H01L 29/7869
(Continued)

(56) References Cited

U.S. PATENT DOCUMENTS

2002/0022307 A1*    2/2002    Park .................. H01L 21/67207
                                                            438/149
2008/0164470 A1*    7/2008    Wang .................. H01L 27/1214
                                                            257/59
(Continued)

FOREIGN PATENT DOCUMENTS

CN        102619621 A    8/2012
CN        102629621 A    8/2012
(Continued)

OTHER PUBLICATIONS

First Office Action for corresponding Chinese Patent Application No. 201210546613.6, 36 pp., (Nov. 18, 2014).
(Continued)

*Primary Examiner* — John C Ingham
*Assistant Examiner* — Didarul Mazumder
(74) *Attorney, Agent, or Firm* — Blakely, Sokoloff, Taylor & Zafman LLP

(57) ABSTRACT

The present invention discloses a thin film transistor (TFT), an array substrate, and fabrication methods thereof, and a display device. The TFT includes a gate, an oxide active layer, a source, and a drain formed on a substrate, wherein a source and drain transition layer is provided between the oxide active layer and the source, the drain. One patterning process is reduced and one mask process is saved through forming the source and drain transition layer between the oxide active layer and the source, the drain, thus effectively simplifying the fabrication procedure. At the same time, the additionally provided source and drain transition layer may prevent the oxide active layer from being corroded during etching, also effectively reduce threshold voltage ($V_{th}$) drift of the TFT, improve $I_{on}$ (on-state current) /$I_{off}$ (off-state current), and enhance thermal stability.

19 Claims, 11 Drawing Sheets

(51) Int. Cl.
*H01L 29/78* (2006.01)
*H01L 29/786* (2006.01)

(58) Field of Classification Search
USPC .................. 257/43; 438/85, 86, 104, 754
See application file for complete search history.

(56) References Cited

U.S. PATENT DOCUMENTS

| | | | |
|---|---|---|---|
| 2009/0283763 A1 | 11/2009 | Park et al. | |
| 2010/0032668 A1* | 2/2010 | Yamazaki | H01L 29/78621 257/43 |
| 2010/0140612 A1 | 6/2010 | Omura et al. | |
| 2010/0148169 A1 | 6/2010 | Kim et al. | |
| 2010/0159639 A1* | 6/2010 | Sakata | H01L 21/02565 438/104 |
| 2010/0200849 A1 | 8/2010 | Heo et al. | |
| 2011/0089416 A1* | 4/2011 | Yamazaki et al. | 257/43 |
| 2011/0240998 A1 | 10/2011 | Morosawa et al. | |
| 2012/0037908 A1* | 2/2012 | Wu et al. | 257/59 |
| 2012/0056180 A1* | 3/2012 | Chen | H01L 29/66757 257/57 |
| 2012/0132914 A1 | 5/2012 | Chen et al. | |

FOREIGN PATENT DOCUMENTS

| | | |
|---|---|---|
| CN | 102751240 A | 10/2012 |
| CN | 203103309 U | 7/2013 |

OTHER PUBLICATIONS

Second Office Action for corresponding Chinese Patent Application No. 201210546613.6, 6 pp., (Jan. 30, 2015).
European Patent Office Communication enclosing Extended European Search Report for corresponding European Patent Application No. 13196698.8, 7 pp., (Jan. 27, 2014).
European Patent Office Communication enclosing Office Action for corresponding European Patent Application No. 13196698.8, 5 pp., (Jul. 7, 2016).

* cited by examiner

THIN FILM TRANSISTOR AND FABRICATION METHOD THEREOF, ARRAY SUBSTRATE, AND DISPLAY DEVICE

FIELD OF THE INVENTION

The present invention relates to a field of display technology, and particularly, to a thin film transistor (TFT) liquid crystal display and a fabrication method thereof, an array substrate and a fabrication method thereof, and a display device.

BACKGROUND OF THE INVENTION

In recent years, display technology has been developed rapidly, for example, TFT technology has been developed from original a-Si (amorphous silicon) TFT to current LTPS (low temperature poly-silicon) TFT, MILC (metal-induced lateral crystallization) TFT, oxide TFT, etc. While luminescence technology has also been developed from original LCD (liquid crystal display) and PDP (Plasma Display Panel) to current OLED (organic light-emitting diode), AMOLED (Active Matrix/Organic Light Emitting Diode), etc. OLED display is a new generation of display device, compared with LCD display, it has many advantages, such as self-luminance, quick response, wide viewing angle, etc., and can be used for flexible display, transparent display, 3D (three-dimensional) display, etc. But as to both LCD and OLED display, for every pixel, a switching-TFT for controlling the pixel is required to be provided, which can independently control every pixel through a driving circuit without causing crosstalk or other impacts on other pixels.

Oxide TFT which is widely used at present uses oxide semiconductor as an active layer, has characteristics of high mobility, large on-state current, excellent switching characteristics and better uniformity, and can be used in an application requiring quick response and large current, such as in a display with high-frequency, high resolution and large size, an OLED display, etc.

In the prior art, five mask (exposure) processes are generally required in fabricating an oxide TFT backplane, respectively for forming a gate line and a gate, an active layer, an etch stop layer, a source and a drain, a passivation layer and a via hole. Research shows that film performance and complicated preparing process of the etch stop layer greatly affects oxide semiconductor, which usually results in threshold voltage ($V_{th}$) drift, small $I_{on}$ (on-state current)/$I_{off}$ (off-state current) and poor thermal stability of TFT. In addition, fabrication of the etch stop layer needs a separate mask process, and fabrication cost is increased accordingly.

SUMMARY OF THE INVENTION

An object of the present invention is to provide a thin film transistor (TFT) and a fabrication method thereof, an array substrate and a fabrication method thereof, and a display device, which can effectively reduce one patterning process. As for an oxide TFT without an etch stop layer, fabrication procedure can be effectively simplified and stability of oxide TFT can be improved. At the same time, annealing treatment on an oxide active layer and a source and drain transition layer under a certain condition may cause $H^+$ in the source and drain transition layer to penetrate into the active layer, which can convert the active layer into a conductor, such that an active region of the active layer keeps good semiconductor characteristics, while regions where the active layer and the source and drain transition layer contact has conductor characteristics. Improvements in annealing steps under a certain condition in fabrication methods of a TFT and an array substrate may effectively improve switching performance of the TFT and the array substrate.

To achieve the above object, the present invention provides a TFT, which includes a gate, a gate insulation layer, an oxide active layer, a source, and a drain, wherein a region of the oxide active layer corresponding to a gap between the source and the drain is an active region. The TFT further includes: a source transition layer between the source and the oxide active layer, and a drain transition layer between the drain and the oxide active layer, wherein the source transition layer is formed on the oxide active layer, and the source is formed on the source transition layer; the drain transition layer is formed on the oxide active layer, and the drain is formed on the drain transition layer; the source transition layer and the drain transition layer are not connected; and the source transition layer and the drain transition layer are in direct contact with the oxide active layer.

The source transition layer has the same pattern as the source, and the drain transition layer has the same pattern as the drain.

The source transition layer and the drain transition layer extend towards the active region relative to positions of the source and the drain, and partially cover the active region.

The source transition layer and the drain transition layer have thickness in the range of 10 nm-1000 nm.

The oxide active layer of the TFT includes the active region, a source contact region and a drain contact region, wherein the active region represents semiconductor characteristics, and the source contact region and the drain contact regions represent conductor characteristics.

The active region of the oxide active layer has a resistivity larger than $10^6$ Ω·cm~$10^9$ Ω·cm, the source contact region and the drain contact region of the oxide active layer have a resistivity smaller than $1 \times 10^{-3}$ Ω·cm.

The source transition layer and the drain transition layer are formed in the same patterning process as the source and the drain.

Further, the TFT is configured such that the gate is formed on a substrate, the gate insulation layer is formed on the gate and the oxide active layer is formed on the gate insulation layer.

Further, the TFT is configured such that the source and the drain are formed on a substrate, the source transition layer and the drain transition layer are formed on the source and the drain, respectively, and the oxide active layer, the gate insulation layer and the gate are sequentially formed on the source transition layer and the drain transition layer.

Further, the TFT is configured such that the oxide active layer is formed on a substrate, the gate insulation layer is formed on the source and the drain, and the gate is formed on the gate insulation layer.

In the above technical solutions, material of the source transition layer and the drain transition layer is a heavily doped semiconductor material including at least one element from B, Si, Ge and Te.

To achieve the above object, the present invention provides an array substrate, which includes a gate line, a data line, a pixel electrode, a TFT, a passivation layer and a via hole in the passivation layer, the TFT includes a gate, a gate insulation layer, an oxide active layer, a source, and a drain, wherein a region of the oxide active layer corresponding to a space between the source and the drain is an active region. The TFT further includes: a source transition layer between the source and the oxide active layer, and a drain transition layer between the drain and the oxide active layer, wherein the source transition layer is formed on the oxide active layer, and the source is formed on the source transition layer; the drain transition layer is formed on the oxide active layer, and the drain is formed on the drain transition layer; the source transition layer and the drain transition layer are not connected; and both the source transition layer and the drain transition layer are in direct contact with the oxide active layer.

The source transition layer has the same pattern as the source, and the drain transition layer has the same pattern as the drain.

The source transition layer and the drain transition layer extend towards the active region relative to positions of the source and the drain, and partially cover the active region.

The source transition layer and the drain transition layer have thickness in the range of 10 nm-1000 nm.

The oxide active layer of the TFT includes the active region, a source contact region and a drain contact region, wherein the active region represents semiconductor characteristics, and the source contact region and the drain contact regions represent conductor characteristics.

The active region of the oxide active layer has a resistivity larger than $10^6$ Ω·cm~$10^9$ Ω·cm, the source contact region and the drain contact region of the oxide active layer have a resistivity smaller than $1\times10^{-3}$ Ω·cm.

The source transition layer and the drain transition layer are formed in the same patterning process as the source and the drain.

Further, the array substrate is configured such that the gate line and the gate are formed on a substrate, the gate insulation layer is formed on the gate line and the gate, the oxide active layer is formed on the gate insulation layer, and the passivation layer and the pixel electrode are sequentially formed on the source and the drain.

Further, the array substrate is configured such that the source, the drain and the data line are formed on a substrate, the source transition layer and the drain transition layer are formed on the source and the drain, respectively, and the oxide active layer, the gate insulation layer, and the gate are sequentially formed on the source transition layer and the drain transition layer.

Further, the array substrate is configured such that the oxide active layer is formed on a substrate, the gate insulation layer is formed on the source and the drain, and the gate and the pixel electrode are formed on the gate insulation layer.

Even further, the array substrate is configured such that the array substrate includes a first TFT and a second TFT, the gate line, a first gate and a second gate are formed on a substrate, wherein the first gate and the second gate are not in contact; the gate insulation layer is formed on the gate line, the first gate and the second gate, wherein a first oxide active layer is formed on the gate insulation layer of the first gate, a second oxide active layer is formed on the gate insulation layer of the second gate, a first source transition layer and a first drain transition layer are formed on the first oxide active layer, a second source transition layer and a second drain transition layer are formed on the second oxide active layer, a first source and a first drain are respectively formed on the first source transition layer and the first drain transition layer, a second source and a second drain are respectively formed on the second source transition layer and the second drain transition layer, the passivation layer and a first via hole, a second via hole and a third via hole in the passivation layer are finally formed on the above substrate, and a pattern including a first pixel electrode and a second pixel electrode is formed on the substrate subjected to the foregoing steps, wherein the first pixel electrode is connected to the first drain and the second gate through the first via hole and the second via hole, respectively, and the second pixel electrode is connected to the second drain through the third via hole.

In the above technical solutions, material of the source transition layer and the drain transition layer is a heavily doped semiconductor material including at least one element from B, Si, Ge and Te.

To achieve the above object, the present invention also provides a fabrication method of a TFT, the TFT includes a gate, a gate insulation layer, an oxide active layer, a source and a drain, wherein, a region of the oxide active layer corresponding to a space between the source and the drain is an active region, wherein the method includes: forming a transition layer film on the oxide active layer, forming a metal film on the transition layer film, and forming the source, the drain, the source transition layer and the drain transition layer through a patterning process, wherein the source transition layer is formed between the source and the oxide active layer; the drain transition layer is formed between the drain and the oxide active layer; the source transition layer and the drain transition layer are not connected; and the source transition layer and the drain transition layer are in direct contact with the oxide active layer.

Further, the fabrication method of a TFT includes:

Step 1: depositing a gate metal film on a substrate, and forming a pattern including the gate through a patterning process;

Step 2: forming the gate insulation layer on the substrate subjected to the foregoing step;

Step 3: forming an oxide active layer film on the substrate subjected to the foregoing steps, and forming a pattern including the oxide active layer through a patterning process;

Step 4: depositing a source and drain transition layer film on the substrate subjected to the foregoing steps, then depositing a source and drain metal film on the source and drain transition layer film, and forming a pattern including the source, the drain, the source transition layer, the drain transition layer and the active region through a single patterning process, wherein, the source transition layer and the drain transition layer have thickness in the range of 10 nm-1000 nm; and Step 5: performing an annealing treatment on the substrate subjected to the foregoing steps in an atmosphere of $O_2$ or air under a condition with a specific pressure in the range of $0.5\times10^5$ Pa-$1.2\times10^5$ Pa, a temperature in the range of 200-300° C. and an annealing time in the range of 60-90 Min.

Further, the fabrication method of a TFT includes:

Step 1: depositing a source and drain metal film on a substrate, and forming a pattern including the source and the drain through a patterning process;

Step 2: depositing a source and drain transition layer film on the substrate subjected to the foregoing step, and forming a pattern including the source transition layer and the drain transition layer through a patterning process, wherein the source transition layer and the drain transition layer have thickness in the range of 10 nm-1000 nm;

Step 3: forming an oxide active layer film on the substrate subjected to the foregoing steps, and forming a pattern including the oxide active layer through a patterning process;

Step 4: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min;

Step 5: forming the gate insulation layer on the substrate subjected to the foregoing steps; and Step 6: depositing a gate metal film on the substrate subjected to the foregoing steps, and forming a pattern including the gate through a patterning process.

Further, the fabrication method of a TFT includes:

Step 1: depositing an oxide active layer film on a substrate, and forming a pattern including the oxide active layer through a patterning process;

Step 2: depositing a source and drain transition layer film on the substrate subjected to the foregoing step;

Step 3: depositing a source and drain metal film on the substrate subjected to the foregoing steps, and forming a pattern including the source, the drain, the source transition layer, the drain transition layer and the active region through a single patterning process, wherein the source transition layer and the drain transition layer have thickness in the range of 10 nm-1000 nm:

Step 4: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min;

Step 5: forming the gate insulation layer on the substrate subjected to the foregoing steps; and Step 6: depositing a gate metal film on the substrate subjected to the foregoing steps, and forming a pattern including the gate through a patterning process.

Material of the source transition layer and the drain transition layer in the fabrication method of a TFT is a heavily doped semiconductor material including at least one element from B, Si, Ge and Te.

To achieve the above object, the present invention also provides a fabrication method of an array substrate, the array substrate includes a TFT, a gate line, a pixel electrode, a data line, and a power line, wherein the TFT includes a gate, a gate insulation layer, an oxide active layer, a source and a drain, a region of the oxide active layer corresponding to a space between the source and the drain is an active region, wherein the method includes: forming a transition layer film on the oxide active layer, forming a metal film on the transition layer film, and forming the source, the drain, the source transition layer and the drain transition layer through a patterning process, wherein the source transition layer is formed between the source and the oxide active layer; the drain transition layer is formed between the drain and the oxide active layer; the source transition layer and the drain transition layer are not connected; and the source transition layer and the drain transition layer are in direct contact with the oxide active layer.

Further, the fabrication method of an array substrate includes:

Step 1: depositing a gate metal film on a substrate, and forming a pattern including the gate, the gate line and a common electrode line through a patterning process;

Step 2: forming the gate insulation layer on the substrate subjected to the foregoing step;

Step 3: forming an oxide active layer film on the substrate subjected to the foregoing steps, and forming a pattern including the oxide active layer through a patterning process;

Step 4: depositing a source and drain transition layer film on the substrate subjected to the foregoing steps, then depositing a source and drain metal film on the source and drain transition layer film, and forming a pattern including the source, the drain, the source transition layer, the drain transition layer and the active region through a single patterning process, wherein the source transition layer and the drain transition layer have thickness in the range of 10 nm-1000 nm:

Step 5: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min;

Step 6: depositing a passivation layer on the substrate subjected to the foregoing steps, and forming a pattern including a via hole in the passivation layer through a patterning process, wherein the via hole in the passivation layer passes through the passivation layer to be connected to the drain; and Step 7: depositing a transparent conductive film on the substrate subjected to the foregoing steps, and forming a pattern including the pixel electrode through a patterning process, such that the pixel electrode is connected to the drain through the via hole in the passivation layer.

Further, the fabrication method of an array substrate includes:

Step 1: depositing a source and drain metal film on a substrate, and forming a pattern including the source, the drain and the data line through a patterning process;

Step 2: depositing a source and drain transition layer film on the substrate subjected to the foregoing step, and forming a pattern including the source transition layer and the drain transition layer through a patterning process, wherein the source transition layer and the drain transition layer have thickness in the range of 10 nm-1000 nm;

Step 3: forming an oxide active layer film on the substrate subjected to the foregoing steps, and forming a pattern including the oxide active layer through a patterning process;

Step 4: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min;

Step 5: forming the gate insulation layer on the substrate subjected to the foregoing steps;

Step 6: depositing a gate metal film on the substrate subjected to the foregoing steps, and forming a pattern including the gate and the gate line through a patterning process; and Step 7: depositing a transparent conductive film on the substrate subjected to the foregoing steps, and forming a pattern including the pixel electrode through a patterning process, such that the pixel electrode is connected to the drain through a via hole in the passivation layer.

Further, the fabrication method of an array substrate includes:

Step 1: depositing an oxide active layer film on a substrate, and forming a pattern including the oxide active layer through a patterning process;

Step 2: depositing a source and drain transition layer film on the substrate subjected to the foregoing step;

Step 3: depositing a source and drain metal film on the substrate subjected to the foregoing steps, and forming a pattern including the source, the drain, the source transition layer, the drain transition layer and the active region through a single patterning process, wherein the source transition layer and the drain transition layer have thickness in the range of 10 nm-1000 nm:

Step 4: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min;

Step 5: forming the gate insulation layer on the substrate subjected to the foregoing steps;

Step 6: depositing a gate metal film on the substrate subjected to the foregoing steps, and forming a pattern including the gate and the gate line through a patterning process; and Step 7: depositing a transparent conductive film on the substrate subjected to the foregoing steps, and forming a pattern including the pixel electrode through a patterning process such that the pixel electrode is connected to the drain through a via hole in the passivation layer.

Further, the fabrication method of an array substrate includes:

Step 1: depositing a gate metal film on a substrate, and forming a pattern including a first gate, a second gate and the gate line through a patterning process using a common mask;

Step 2: forming the gate insulation layer on the substrate subjected to the foregoing step;

Step 3: depositing an oxide active layer film on the substrate subjected to the foregoing steps, and forming a pattern including a first oxide active layer and a second oxide active layer through a patterning process;

Step 4: depositing a source and drain transition layer film on the substrate subjected to the foregoing steps, then depositing a source and drain metal film on the source and drain transition layer film, and forming a pattern including a first source, a first drain, a first source transition layer, a first drain transition layer, the data line, a second source, a second drain, a second source transition layer, a second drain transition layer and the power line through a single patterning process, wherein the first and second source transition layers and the first and second drain transition layers have thickness in the range of 10 nm-1000 nm;

Step 5: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min;

Step 6: depositing a passivation layer film on the substrate subjected to the foregoing steps, forming a pattern including a first via hole, a second via hole and a third via hole in the passivation layer through a patterning process, wherein the first via hole is located at a position where the first drain is positioned, and passes through the passivation layer to reach the first drain; the second via hole is located at a position where the second gate is positioned, and passes through the passivation layer and the gate insulation layer to reach the second gate; the third via hole is located at a position where the second drain is positioned, and passes through the passivation layer to reach the second drain;

Step 7: depositing a transparent conductive film on the substrate subjected to the foregoing steps, forming a pattern including a first pixel electrode and a second electrode through a patterning process such that the first pixel electrode is connected to the first drain and the second gate through the first via hole and the second via hole, respectively, and the second pixel electrode is connected to the second drain through the third via hole.

Material of the source transition layer and the drain transition layer in the fabrication method of an array substrate is a heavily doped semiconductor material including at least one element from B, Si, Ge and Te.

The present invention also provides a display device, which includes the array substrate.

The present invention provides a TFT and a fabrication method thereof, an array substrate and a fabrication method thereof, and a display device, the oxide active layer may be prevented effectively from being corroded by an etchant during performing wet etching on the source and drain metal layer by forming the source transition layer between the source and the oxide active layer and the drain transition layer between the drain and the oxide active layer, and compared with the prior art, the present invention may reduce one patterning process and save one mask process by omitting an etch stop layer, thus effectively simplifying the fabrication procedure. At the same time, the annealing treatment on the oxide active layer under a certain condition may cause the area where the oxide active layer contacts the source and drain transition layer has conductor characteristics, as $H^+$ in the source and drain transition layer penetrates into the active layer, and an active region of the active layer keeps semiconductor characteristics. Improvements in the annealing process under a certain condition in the fabrication methods of a TFT and an array substrate may effectively improve switching performance of the TFT and the array substrate. In addition, threshold voltage ($V_{th}$) drift of the TFT is effectively reduced, $I_{on}$ (on-state current)/$I_{off}$ (off-state current) is improved, and thermal stability is enhanced. The present invention has simple technical means, is easy to implement and has a broad application prospect.

DETAILED DESCRIPTION OF EMBODIMENTS

Figure 1:
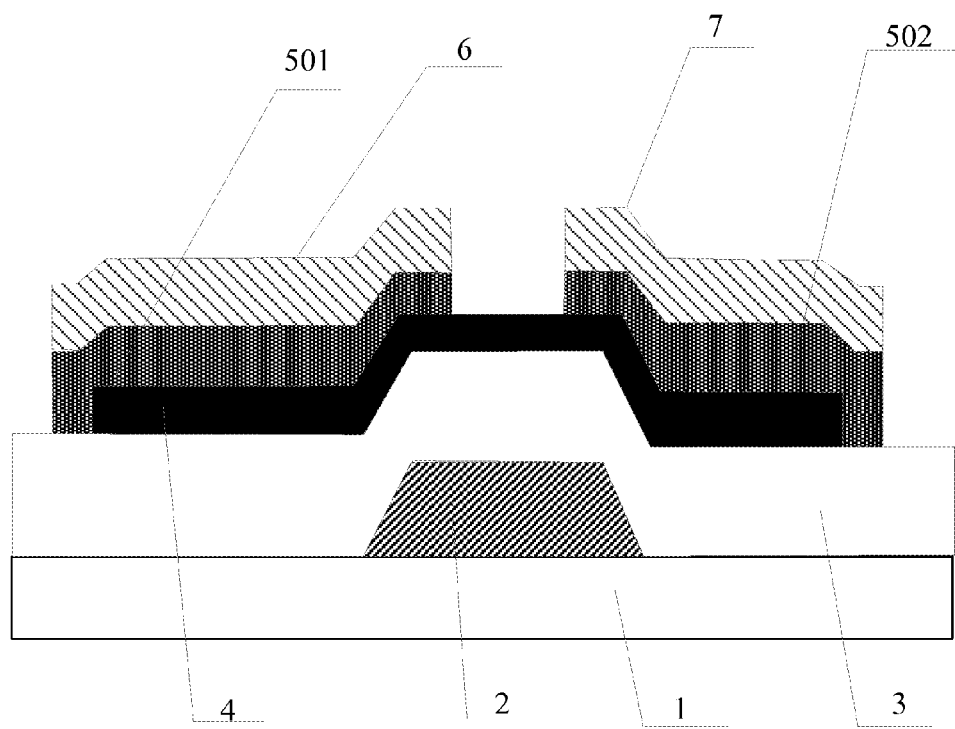
FIG. 1 is a cross-sectional diagram of a TFT according to a first embodiment of the present invention.

Technical solutions of the present invention will be described below in further details by way of drawings and embodiments. Embodiments of the present invention take an AMOLED array substrate for example, and the person skilled in the art should understand that the array substrate is not only used in an AMOLED display device, but also used in a TFT-LCD, e-paper, or the like. Thickness of each layer film as well as size and shape of a region in the drawings do not reflect actual scale of the AMOLED array substrate, which are only to exemplarily illustrate contents of the present invention. In addition, in the TFT described in the text, when a gate voltage turns on the TFT, a conductive channel is generated at a region of the oxide active layer corresponding to a gap (space) between the source and the drain (i.e., active region).

In the text, when an element or layer is described as being "on" another element or layer, there may be intermediate structures existing there between; when an element or layer is described as being "directly on" another element or layer, there is no intermediate structure there between. Spatially relative terms, such as "below," "lower." "above," "on" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "on" or "above" other elements or features would then be oriented "below" or "beneath" the other elements or features.

<First Embodiment>

FIG. 1 is a cross-sectional diagram of a TFT according to a first embodiment of the present invention, which illustrates a structure of a TFT. The TFT of this embodiment mainly includes a gate 2, a gate insulation layer 3, an oxide active layer 4, a source 6 and a drain 7 formed on a substrate 1. The TFT further includes a source and drain transition layer, the source and drain transition layer is formed between the oxide active layer 4 and the source 6, the drain 7, wherein parts of the source and drain transition layer corresponding to the source 6 and the drain 7 are a source transition layer 501 and a drain transition layer 502, respectively, and the source transition layer 501 and the drain transition layer 502 are separated from each other. Specifically, the source transition layer 501 may have the same pattern as the source 6, and the drain transition layer 502 may have the same pattern as the drain 7; alternatively, the source transition layer 501 and the drain transition layer 502 may respectively have different patterns from the source 6 and the drain 7 as required, the source transition layer 501 and the drain transition layer 502 may extend towards the active region relative to the source 6 and the drain 7, and partially cover the active region. Hereafter, an annealing treatment is performed in an atmosphere of $O_2$ or air to cause the active region of the oxide active layer 4 to keep good semiconductor characteristics, as $H^+$ in the source transition layer 501 and the drain transition layer 502 penetrates into the oxide active layer 4, a source contact region and a drain contact region of the oxide active layer 4 are converted into conductors. For example, when In—Ga—Zn-Oxide (IGZO) is used as the oxide active layer, annealing is performed under a condition with an $O_2$ pressure in the range of $0.5 \times 10^5$ Pa-$1.2 \times 10^5$ Pa, a temperature in the range of 200-300° C. and an annealing time in the range of 60-90 Min. After annealing, the resistivity of the active region of the oxide active layer 4 is larger than $10^6$ Ω·cm, representing semiconductor characteristics, and the resistivity of the source contact region and the drain contact region of the oxide active layer 4 is smaller than $1 \times 10^{-3}$ Ω·cm, representing conductor characteristics. Wherein, thickness of the source transition layer 501 and the drain transition layer 502 is in the range of 10 nm-1000 nm; material of the source transition layer 501 and the drain transition layer 502 is a heavily doped semiconductor material including at least one element from B, Si, Ge and Te.

Specifically, in this embodiment, the gate 2 is disposed on the substrate 1 through a first patterning process. Hereafter, the gate insulation layer 3 is formed on the gate 2.

A pattern including the oxide active layer 4 is formed through a second patterning process, wherein, the oxide active layer 4 is disposed above the gate 2.

Then, a source and drain transition layer film is formed on the oxide active layer 4. Hereafter, a source and drain metal film is deposited on the source and drain transition layer film. In a third patterning process, wet etching is only performed on the source and drain metal film to form a pattern including the source 6 and the drain 7. At this point, the source and drain transition layer film still covers the oxide active layer 4 tightly to prevent the oxide active layer 4 from being corroded and contaminated by the acid liquor of the wet etching. As the material of the source and drain transition layer is a heavily doped semiconductor material including at least one element from B, Si, Ge and Te, the source and drain transition layer has good electric conductivity, and when it was disposed under the source 6 and the drain 7, the source 6 and the drain 7 can be electrically connected, such that the TFT loses the function of controlling every independent pixel. Therefore, to ensure normal operation of the TFT, the source and drain transition layer film need to be etched after the etching on the source and drain metal film is finished, dry etching may be used, and the purpose of etching is to form a gap (space) between the source transition layer 501 and the drain transition layer 502, such that the source transition layer 501 and the drain transition layer 502 are not connected. When performing dry etching on the source and drain transition layer, no extra mask is required, and the metal pattern of the source and the drain formed before can be used as a mask. Therefore, the etching on the source and drain metal film and the etching on the source and drain transition layer can be performed in one patterning process, and only one mask is required.

The pattern formed by etching the source and drain transition layer film may have the same shape and size as the source and the drain, that is, the source transition layer 501 may have the same pattern as the source 6, and the drain transition layer 502 may have the same pattern as the drain 7; alternatively, the pattern formed by etching the source and drain transition layer film may have a different shape and size from the source and the drain, that is, the source transition layer 501 and the drain transition layer 502 extend towards the active region relative to the positions of the source 6 and the drain 7, and partially cover the active region. Wherein, the size of the gap between the source transition layer 501 and the drain transition layer 502 is adjusted by strength of the gas flow used in the dry etching and etching time. Through this patterning process, a pattern is formed, in which one end of the source 6 is disposed on the source transition layer 501, and the other end is connected to the data line, one end of the drain 7 is disposed on the drain transition layer 502 and the other end is formed in an area corresponding to the pixel electrode. A gap is formed between the source transition layer 501 and the drain transition layer 502 to ensure that they are not connected; the portion of the source and drain metal layer film corresponding to the TFT active region is etched away completely and the portion of the source and drain transition layer film corresponding to the TFT active region of a partial width is at least etched away to expose the active region of the oxide active layer 4 of the TFT; a region of the oxide active layer between the source 6 and the drain 7 forms the active region. It should be noted that the source transition layer 501 and the drain transition layer 502 are formed in the same patterning process as the source 6 and the drain 7.

An annealing treatment is performed on the substrate subjected to the above processing in an atmosphere of $O_2$ or air to form the oxide active layer including the active region, the source contact region and the drain contact region, wherein the active region represents semiconductor characteristics, and the source contact region and the drain contact region represent conductor characteristics. Specifically, the resistivity of the active region of the oxide active layer is larger than $10^6$ $\Omega \cdot cm \sim 10^9$ $\Omega \cdot cm$, and the resistivity of the source contact region and the drain contact region of the oxide active layer is smaller than $1 \times 10^{-3}$ $\Omega \cdot cm$; the thickness of the source transition layer 501 and the drain transition layer 502 is in the range of 10 nm-1000 nm.

It should be noted that a source and a drain of a TFT are named to vary with a flow direction of current, and for convenience of description, the one connected to the pixel electrode is called a drain in the present invention.

Figure 2:
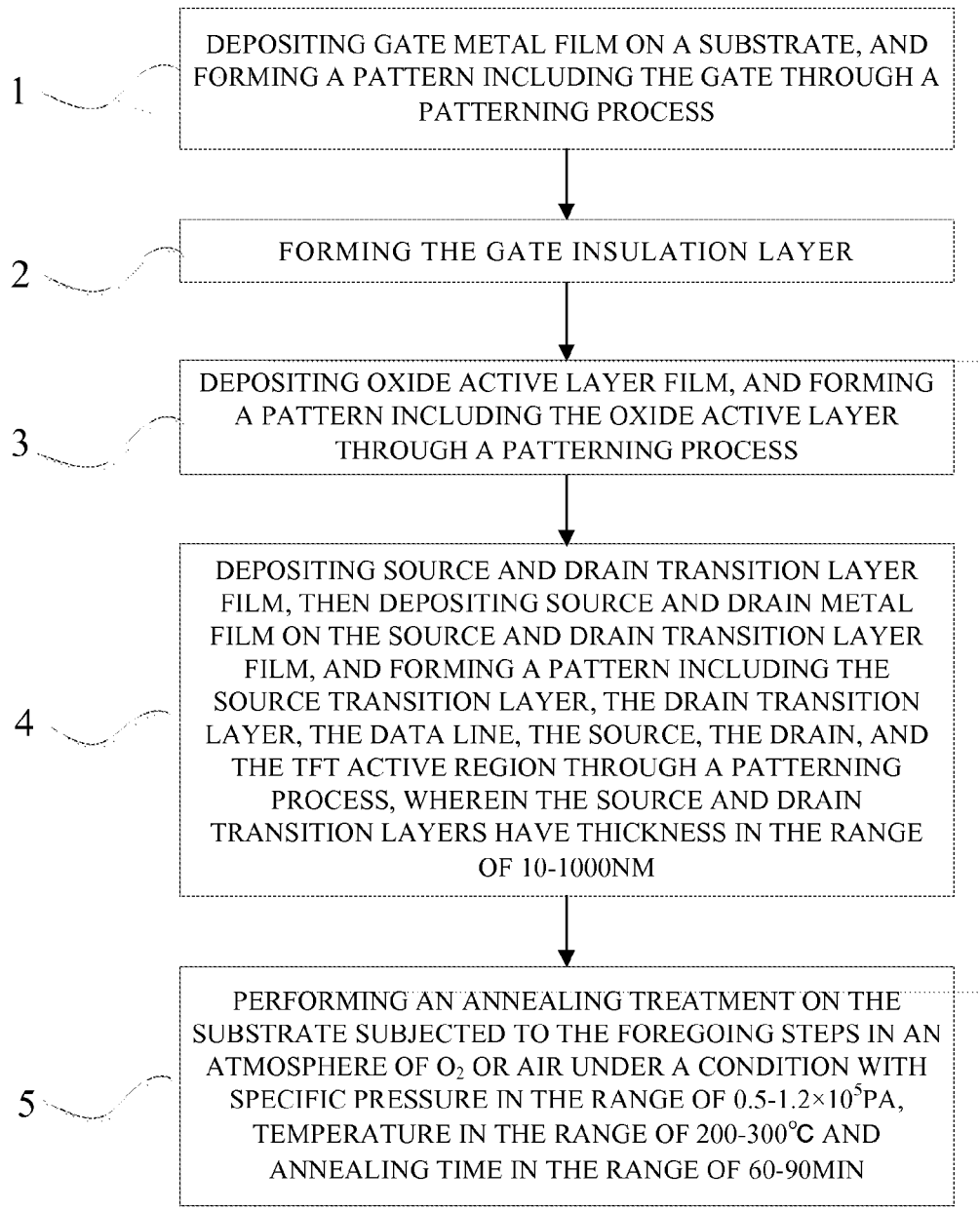
FIG. 2 is a flow chart of a fabrication method of the TFT according to the first embodiment of the present invention.

FIG. 2 is a flow chart of a fabrication method of the TFT according to the first embodiment of the present invention, which includes:

Step 1: depositing a gate metal film on a substrate, and forming a pattern including a gate through a patterning process;

Step 2: forming a gate insulation layer on the substrate subjected to the foregoing step;

Step 3: depositing an oxide active layer film on the substrate subjected to the foregoing steps, and forming a pattern including the oxide active layer through a patterning process;

Step 4: depositing a source and drain transition layer film on the substrate subjected to the foregoing steps, then depositing a source and drain metal film on the source and drain transition layer film, and forming a pattern including a source, a drain, a source transition layer, a drain transition layer and an active region through a patterning process, wherein, the source transition layer and the drain transition layer have thickness in the range of 10 nm-1000 nm; and Step 5: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min.

Further, the TFT and the fabrication method thereof described according to the embodiment of the present invention only describe bottom-gate type structures and fabrication methods thereof, and the technical solutions mentioned in the present invention also apply to top-gate type structures and fabrication methods thereof. Specifically, the top-gate type structures include a structure formed by forming a source and a drain on a substrate, and then sequentially forming a source and drain transition layer, an oxide active layer, a gate insulation layer and a gate on the source and the drain: also include a structure formed by forming an oxide active layer, and then sequentially forming a source and drain transition layer, a source and a drain, a gate insulation layer and a gate on the oxide active layer. Common points between the top-gate type and bottom-gate type TFTs are functions achieved by the source and drain transition layer and the setting arrangement that the source and drain transition layer and the oxide active layer are in direct contact. Therefore, annealing treatment under the specific condition can also be used in the fabrication methods to form conductor regions and a semiconductor region in the oxide active layer. As such, the two top-gate type structures described above and fabrication methods thereof are not elaborated herein.

<Second Embodiment>

Figure 3:
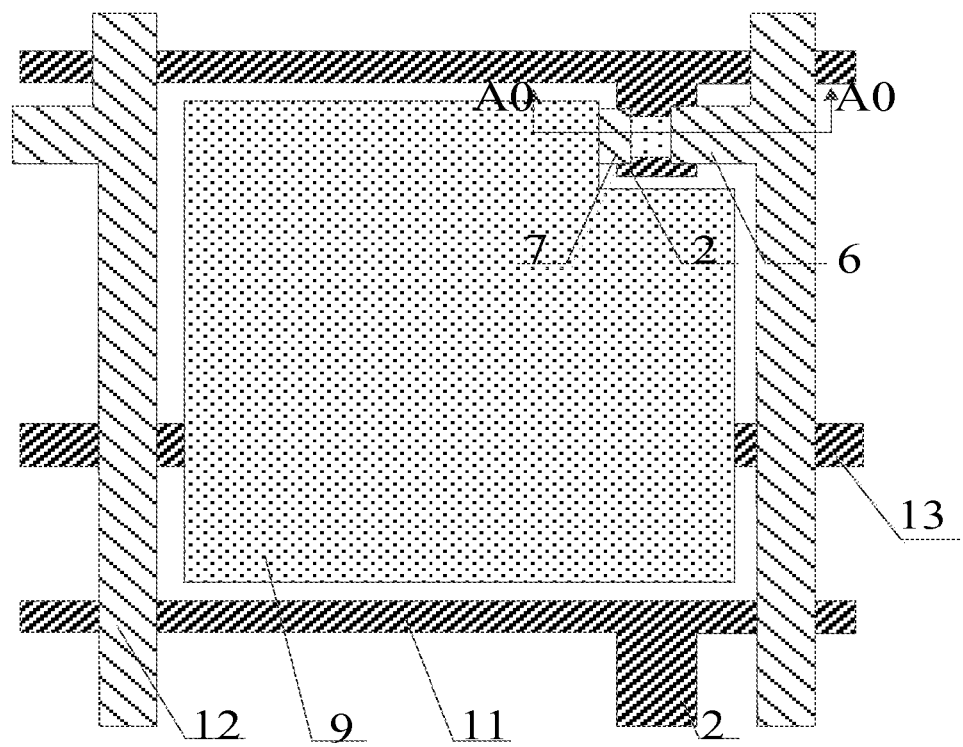
FIG. 3 is a plan view of an array substrate according to a second embodiment of the present invention.
Figure 4:
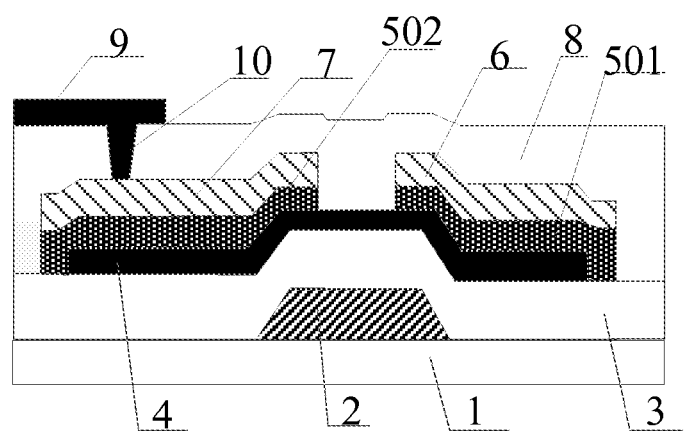
FIG. 4 is a cross-sectional diagram viewed along line A0-A0 in FIG. 3.

FIG. 3 is a plan view of an array substrate according to a second embodiment of the present invention, which illustrates a structure of one pixel unit, and FIG. 4 is a cross-sectional diagram viewed along line A0-A0 in FIG. 3. As illustrated in FIGS. 3 and 4, major structure of a common TFT array substrate in this embodiment mainly includes a gate line 11 formed on a substrate 1, a data line 12, a common electrode line 13, a pixel electrode 9 and a TFT formed on a substrate 1, the gate line 11 and the data line 12 which are perpendicular to each other and intersect define a pixel unit, the TFT and the pixel electrode 9 are formed within the pixel unit, the gate line 11 is used to provide a turned-on or cut-off voltage to the TFT, the TFT is used to control the data line 12 to provide a data voltage to the pixel electrode 9, and the common electrode line 13 is used to form a storage capacitor with the pixel electrode 13. The TFT further includes a source and drain transition layer, the source and drain transition layer is formed between the oxide active layer 4 and the source 6, the drain 7, wherein parts of the source and drain transition layer corresponding to the source 6 and the drain 7 are a source transition layer 501 and a drain transition layer 502, respectively, and the source transition layer 501 and the drain transition layer 502 are separated from each other, and a region of the oxide active layer between the source 6 and the drain 7 forms an active region. Specifically, the source transition layer 501 may have the same pattern as the source 6, and the drain transition layer 502 may have the same pattern as the drain 7; alternatively, the source transition layer 501 and the drain transition layer 502 may respectively have different patterns from the source 6 and the drain 7 as required, the source transition layer 501 and the drain transition layer 502 may extend towards the active region relative to positions of the source 6 and the drain 7, and partially cover the active region.

Hereafter, an annealing treatment is performed in an atmosphere of $O_2$ or air to cause the active region of the oxide active layer 4 to keep good semiconductor characteristics, and as $H^+$ in the source transition layer 501 and the drain transition layer 502 penetrates into the active layer 4, a source contact region and a drain contact region of the oxide active layer 4, which contact the source and drain transition layer, are converted into conductors to present conductor characteristics. For example, when In—Ga—Zn-Oxide (IGZO) is used as the oxide active layer, annealing is performed under a condition with an $O_2$ pressure in the range of $0.5\times10^5$ Pa-$1.2\times10^5$ Pa, a temperature in the range of 200-300° C. and an annealing time in the range of 60-90 Min. After annealing, the resistivity of the active region of the oxide active layer 4 is larger than $10^6$ Ω·cm, representing semiconductor characteristics, and the resistivity of the source contact region and the drain contact region of the oxide active layer 4 is smaller than $1\times10^{-3}$ Ω·cm, representing conductor characteristics. Wherein, the thickness of the source transition layer 501 and the drain transition layer 502 is in the range of 10 nm-1000 nm; the material of the source transition layer 501 and the drain transition layer 502 is a heavily doped semiconductor material including at least one element from B, Si, Ge and Te.

Specifically, in this embodiment, the gate 2, the gate line 11 and the common electrode line 13 are disposed on the substrate 1 and they are formed in a single patterning process, wherein the gate 2 is connected to the gate line 11; a gate insulation layer 3 is formed on the gate 2, the gate line 11 and the common electrode line 13 and covers the whole substrate 1.

A pattern including the oxide active layer 4 is formed through a second patterning process, wherein, the oxide active layer 4 is disposed above the gate 2.

Then, a source and drain transition layer film is deposited on the oxide active layer 4, and a source and drain metal film is then deposited on the source and drain transition layer film. In a third patterning process, wet etching is only performed on the source and drain metal film to form a pattern including the data line 12, the source 6 and the drain 7. At this point, the source and drain transition layer film still covers the oxide active layer 4 tightly to prevent the oxide active layer 4 from being corroded and contaminated by the acid liquor of the wet etching. As the material of the source and drain transition layer is a heavily doped semiconductor material including at least one element from B, Si, Ge and Te, the source and drain transition layer has good electric conductivity, and when it was disposed under the source 6 and the gate 7, the source 6 and the gate 7 can be electrically connected, such that the TFT loses the function of controlling every independent pixel. Therefore, to ensure normal operation of the TFT, the source and drain transition layer film needs to be etched after the etching on the source and drain metal film is finished, dry etching may be used, and the purpose of this etching is to form a gap between the source transition layer 501 and the drain transition layer 502, such that they are not connected. When performing dry etching on the source and drain transition layer, no extra mask is required, since the metal pattern of the source and the drain formed before can be used as a mask. Therefore, the etching on the source and drain metal film and the etching on the source and drain transition layer can be performed in one patterning process, and only one mask is required.

The pattern formed by etching the source and drain transition layer film may have the same shape and size as the source and the drain, that is, the source transition layer 501 may have the same pattern as the source 6, and the drain transition layer 502 may have the same pattern as the drain 7; alternatively, the pattern formed by etching the source and drain transition layer may have a different shape and size from the source and the drain, that is, the source transition layer 501 and the drain transition layer 502 extend towards the active region relative to the positions of the source 6 and the drain 7, and partially cover the active region. Wherein, the size of the gap between the source transition layer 501 and the drain transition layer 502 is adjusted by strength of the gas flow used in the dry etching and etching time. Through this patterning process, a pattern is formed, in which one end of the source 6 is disposed on the source transition layer 501, and the other end is connected to the data line 12, one end of the drain 7 is disposed in the drain transition layer 502 and the other end is formed in an area corresponding to the pixel electrode. A gap is formed between the source transition layer 501 and the drain transition layer 502 to ensure that they are not connected; the portion of the source and drain metal layer film corresponding to the TFT active region is etched away completely and the portion of the source and drain transition layer film corresponding to the TFT active region of a partial width is at least etched away to expose the active region of the oxide active layer 4; a passivation layer 8 is formed on the data line 12, the source 6, the drain 7 and the TFT active region, and covers the whole substrate 1, a via hole 10 in the passivation layer is provided at a position where the drain 7 is located, and this via hole passes through the passivation layer to be connected to the drain 7; the pixel electrode 9 is formed on the passivation layer 8, and is connected to the drain 7 through the via hole 10 in the passivation layer.

It should be noted that a source and a drain of a TFT are named to vary with a flow direction of current, and for convenience of description, the one connected to the pixel electrode is called a drain in the present invention.

Figure 5:
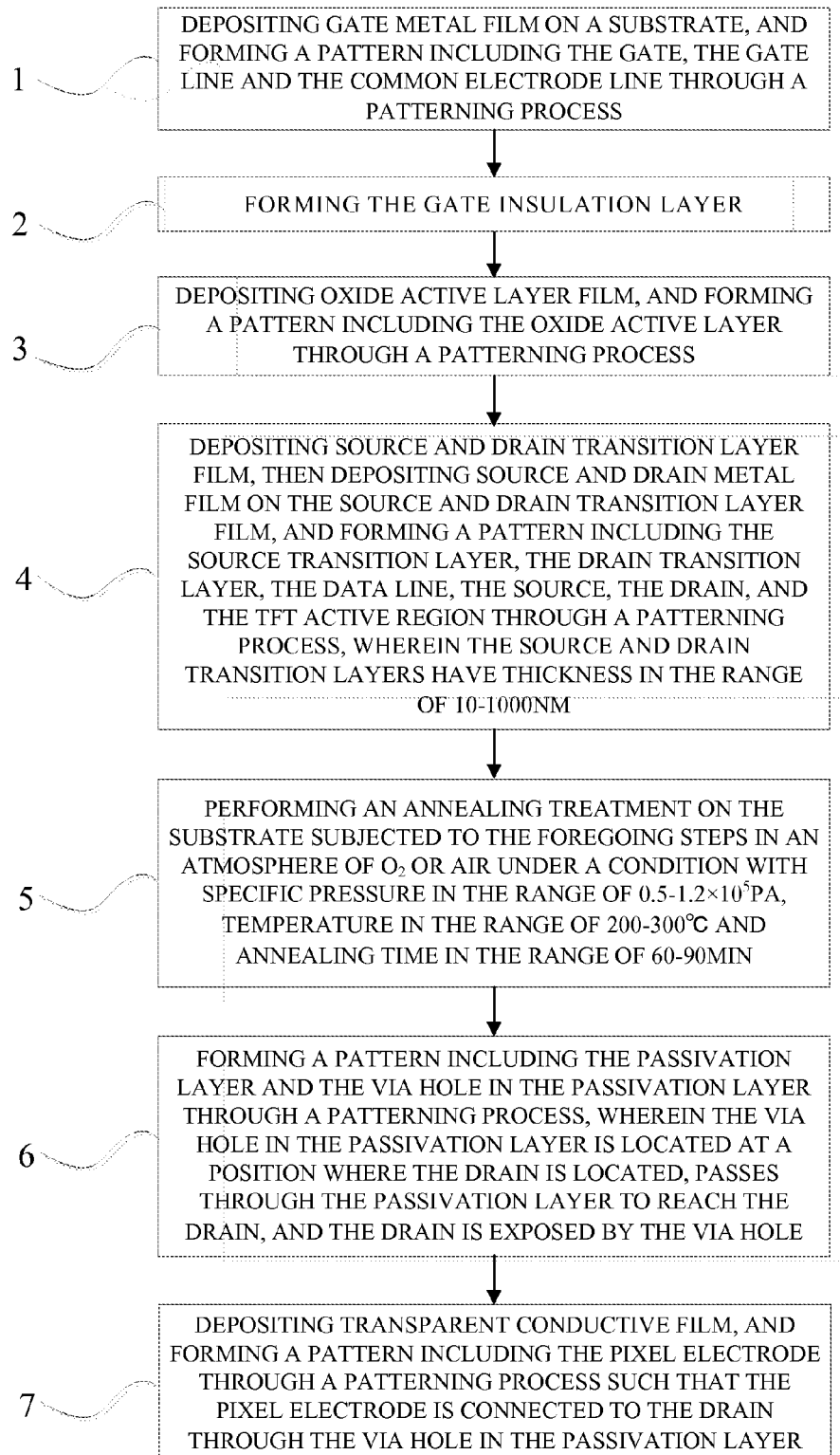
FIG. 5 is a flow chart of a fabrication method of the array substrate according to the second embodiment of the present invention.

FIG. 5 is a flow chart of a fabrication method of the array substrate according to the second embodiment of the present invention, which includes:

Step 1: depositing a gate metal film on a substrate, and forming a pattern including a gate, a gate line and a common electrode line through a patterning process;

Step 2: forming a gate insulation layer on the substrate subjected to the foregoing step;

Step 3: depositing an oxide active layer film on the substrate subjected to the foregoing steps, and forming a pattern including the oxide active layer through a patterning process;

Step 4: depositing a source and drain transition layer film on the substrate subjected to the foregoing steps, then depositing a source and drain metal film on the source and drain transition layer film, and forming a pattern including a source, a drain, a source transition layer, a drain transition layer and an active region through a single patterning process, wherein, the source transition layer and the drain transition layer have thickness in the range of 10 nm-1000 nm;

Step 5: performing an annealing treatment on the substrate subjected to the foregoing steps in an atmosphere of $O_2$ or air under a condition with a specific pressure in the range of $0.5\times10^5$ Pa-$1.2\times10^5$ Pa, a temperature in the range of 200-300° C. and an annealing time in the range of 60-90 Min;

Step 6: depositing a passivation layer film on the substrate subjected to the foregoing steps, and forming a pattern including a passivation layer and a via hole in the passivation layer through a patterning process, wherein the via hole in the passivation layer is positioned at a position where the drain is located, passes through the passivation layer to reach the drain, and the drain is exposed through the via hole;

Step 7: depositing a transparent conductive film on the substrate subjected to the foregoing steps, and forming a pattern including a pixel electrode through a patterning process such that the pixel electrode is connected to the drain through the via hole in the passivation layer.

In the fabrication method of an array substrate according to the second embodiment of the present invention, one patterning process is reduced and one mask process is saved by providing the source and drain transition layer between the oxide active layer and the source and the drain, while omitting an etch stop layer at the same time, thus effectively simplifying the fabrication procedure. At the same time, the additionally provided source and drain transition layer may prevent the oxide active layer from being corroded during the etching on the source and the drain, and may also effectively reduce threshold voltage ($V_{th}$) drift of TFT, improve $I_{on}$ (on-state current)/$I_{off}$ (off-state current) and enhance thermal stability. The second embodiment of the present invention has simple technical means, is easy to implement and has a broad application prospect.

<Third Embodiment>

Figure 6:
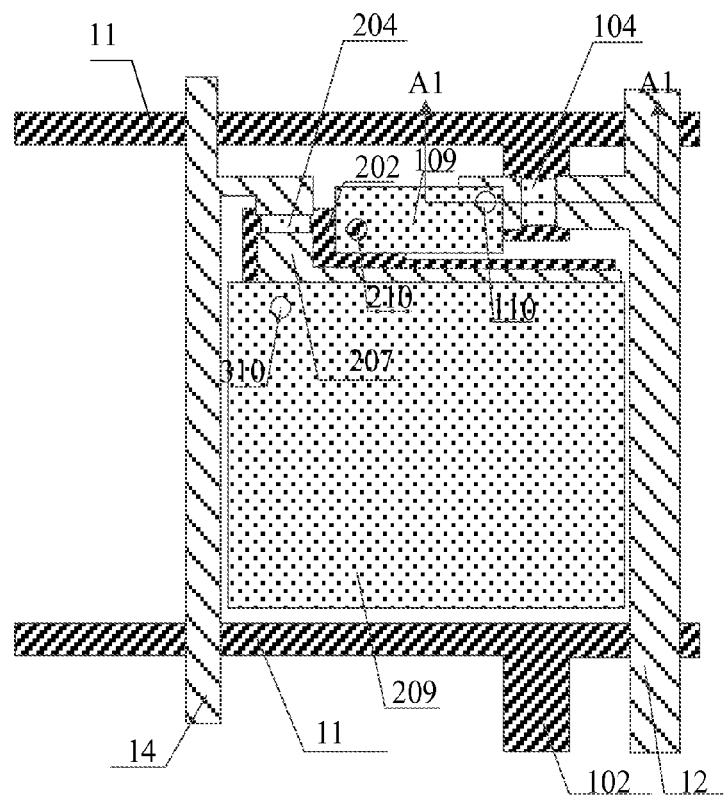
FIG. 6 is a plan view of an array substrate according to a third embodiment of the present invention.
Figure 7:
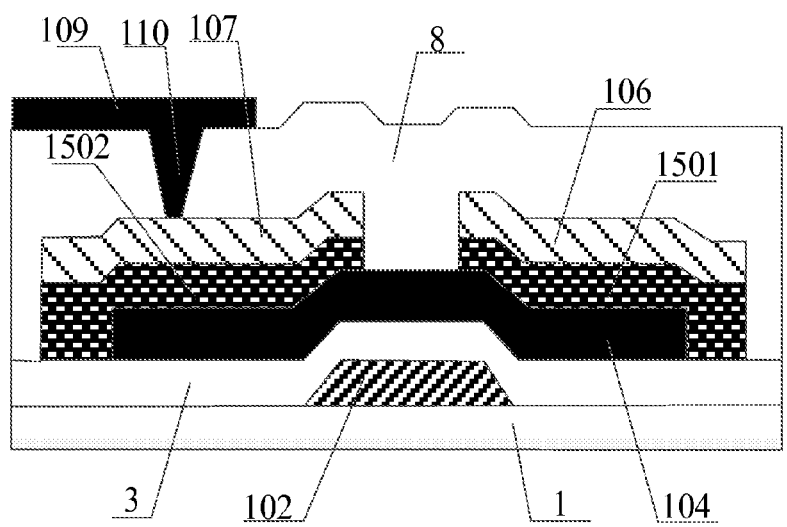
FIG. 7 is a cross-sectional diagram viewed along line A1-A1 in FIG. 6.

This embodiment is a preferable embodiment of the present invention, FIG. 6 is a plan view of an array substrate according to a third embodiment of the present invention, which illustrates a structure of one pixel unit, and FIG. 7 is a cross-sectional diagram viewed along line A1-A1 in FIG. 6. As illustrated in FIGS. 6 and 7, major structure of an active matrix/organic light emitting diode (AMOLED) array substrate in this embodiment mainly includes a gate line 11, a data line 12 and a power line 14, the data line 12 and the power line 14 are perpendicular to the gate lines 11, and define a pixel region together with two adjacent gate lines 11, in the pixel region, a first TFT (also referred to as a switching TFT) as an addressing element, a second TFT (also referred to as a driving TFT) for controlling an organic light emitting diode, a first pixel electrode 109 and a second pixel electrode 209 are formed, the first TFT is positioned at an intersection of the gate lines 11 and the data line 12, and the second TFT is positioned at an intersection of the gate line 11 and the power line 14, wherein, a first drain 107 of the first TFT becomes a second gate 202 of the second TFT through being connected to the first pixel electrode 109; alternatively, the first drain 107 of the first TFT is disposed at a position where the gate of the second TFT is located, to be directly served as the second gate 202.

Specifically, in this embodiment, a first gate 102, the second gate 202 and the gate line 11 are disposed on a substrate 1, and are formed in a single patterning process, wherein, the first gate 102 is connected to the gate line 11, the second gate 202 is not connected to the gate line 11, and the first gate 102 is not connected to the second gate 202; a gate insulation layer 3 is formed on the first gate 102, the second gate 202 and the gate line 11 and covers the whole substrate 1.

A pattern including an oxide active layer is formed through a second patterning process, wherein, a first oxide active layer 104 is disposed above the first gate 102 and a second oxide active layer 204 is disposed above the second gate 202.

A first source and drain transition layer film 5 is disposed on the first oxide active layer 104 and a second source and drain transition layer film 205 is disposed on the second oxide active layer 204.

Hereafter, the data line 12, a first source 106, the first drain 107, a first source transition layer 1501, a first drain transition layer 1502, the power line 14, a second source 206, a second drain 207, a second source transition layer 2501 and a second drain transition layer 2502 are formed in a single patterning process. Wherein, one end of the first source 106 is disposed on the first source transition layer 1501, and the other end is connected to the data line 12; one end of the first drain 107 is disposed on the first drain transition layer 1502, and the other end is formed in an area corresponding to the pixel electrode. A region of the oxide active layer corresponding to the gap between the first source 106 and the first drain 107 forms a first TFT active region, and a gap is formed between the first source transition layer 1501 and the first drain transition layer 1502 to ensure that they are not connected. Meanwhile, one end of the second source 206 is disposed on the second source transition layer 2501, and the other end is connected to the power line 14; one end of the second drain 207 is disposed on the second drain transition layer 2502, and the other end is formed in an area corresponding to the pixel electrode. A region of the oxide active layer corresponding to the gap between the second source 206 and the second drain 207 forms a second TFT active region, and a gap is formed between the second source transition layer 2501 and the second drain transition layer 2502 to ensure that they are not connected. Specifically, the first source transition layer 1501 may have the same pattern as the first source 106, and the first drain transition layer 1502 may have the same pattern as the first drain 107; the second source transition layer 2501 may have the same pattern as the second source 206, and the second drain transition layer 2502 may have the same pattern as the second drain 107; alternatively, the first source transition layer 1501, the first drain transition layer 1502, the second source transition layer 2501, and the second drain transition layer 2502 may respectively have different patterns from the first source 106, the first drain 107, the second source 206 and the second drain 207 as required, the first source transition layer 1501 and the first drain transition layer 1502 may extend towards the first active region relative to positions of the first source 106 and the first drain 107, and partially cover the first active region, and/or the second source transition layer 2501 and the second drain transition layer 2502 may extend towards the second active region relative to positions of the second source 206 and the second drain 207, and partially cover the second active region Hereafter, an annealing treatment is performed in an atmosphere of $O_2$ or air, such that the active regions of the oxide active layer keep good semiconductor characteristics, while regions where the first oxide active layer 104 contacts with the first source and drain transition layers (i.e., a first source contact region and a first drain contact region), and regions where the second oxide active layer 204 contacts with the second source and drain transition layers (i.e., a second source contact region and a second drain contact region) represent conductor characteristics. As $H^+$ in the first source transition layer 1501, the first drain transition layer 1502, and $H^+$ in the second source transition layer 2501, the second drain transition layer 2502 penetrate into the first oxide active layer 104 and the second oxide active layer 204, respectively, such that the first source contact region and the first drain contact region of the first oxide active layer 104, and the second source contact region and the second drain contact region of the second oxide active layer 204 are converted into conductors. For example, when In—Ga—Zn-Oxide (IGZO) is used as the oxide active layers, annealing is performed under a condition with an $O_2$ pressure in the range of $0.5 \times 10^5$ Pa-$1.2 \times 10^5$ Pa, a temperature in the range of 200-300° C. and an annealing time in the range of 60-90 Min. After annealing, the resistivity of the active regions of the respective oxide active layers is larger than $10^6$ Ω·cm, representing semiconductor characteristics, and the resistivity of the source contact regions and the drain contact regions of the respective oxide active layers is smaller than $1 \times 10^{-3}$ Ω·cm, representing conductor characteristics.

Wherein, thickness of the first source transition layer 1501, second source transition layer 2501, the first drain transition layer 1502 and second drain transition layer 2502 is in the range of 10 nm-1000 nm; material of the first source transition layer 1501, second source transition layer 2501, the first drain transition layer 1502 and second drain transition layer 2502 is a heavily doped semiconductor material including at least one element from B, Si, Ge and Te.

A passivation layer 8 is formed on the substrate subjected to the above steps to cover the whole substrate 1. Then, a first via hole 110, a second via hole 210 and a third via hole 310 are provided in the passivation layer 8, wherein the first via hole 110 is provided above the first drain 107, and passes through the passivation layer 8 to reach the first drain 107, the second via hole 210 is provided above the second gate 202, and passes through the passivation layer 8 and the gate insulation layer 3 to reach the second gate 202, and the third via hole 310 is provided above the second drain 207, and passes through the passivation layer 8 to reach the second drain 207.

A transparent conductive film is deposited on the substrate subjected to the above patterning process to form a pattern including the first pixel electrode 109 and the second pixel electrode 209, wherein, the first pixel electrode 109 is formed on the passivation layer 8, only covers parts of the passivation layer 8 corresponding to the first drain 107 and the second gate 202, and is connected to the first drain 107 and the second gate 202 through the first via hole 110 and the second via hole 210, respectively, and the first pixel electrode 109 connects the first drain 107 with the second gate 202; at the same time, the second pixel electrode 209 is formed on the passivation layer 8, covers the whole display region and a part of the second drain 207, and is connected to the second drain 207 through the third via hole 310.

FIGS. 8-16 are schematic diagrams of fabrication process of the array substrate according to the third embodiment of the present invention, which can further describe the technical solution of this embodiment. In the following description, a patterning process described in the present invention includes photoresist coating, mask alignment, exposure, etching, photoresist stripping, and other processing steps, and positive photoresist is taken as an example of photoresist.

Figure 8:
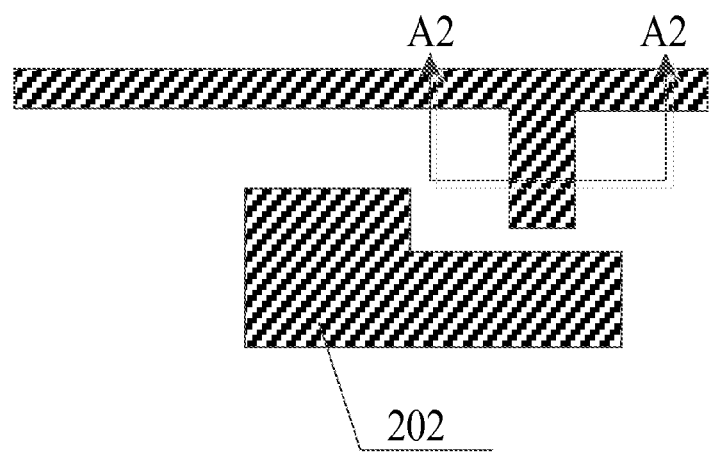
FIG. 8 is a plan view of the array substrate subjected to the first process according to the third embodiment of the present invention.
Figure 8:
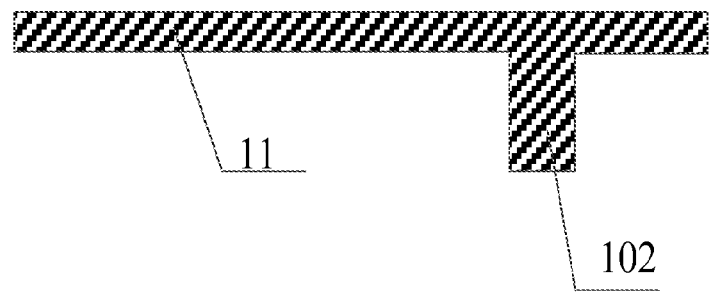
Figure 9:
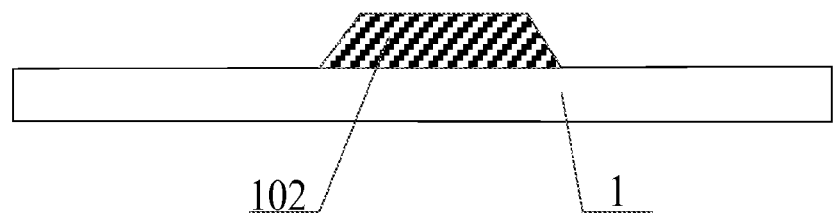
FIG. 9 is a cross-sectional diagram viewed along line A2-A2 in FIG. 8.

FIG. 8 is a plan view of the array substrate subjected to the first process according to the third embodiment of the present invention, which illustrates an intermediate structure of a pixel unit, and FIG. 9 is a cross-sectional diagram viewed along line A2-A2 in FIG. 8. A layer of gate metal film is deposited on a substrate 1 (such as a glass substrate or a quartz substrate) by way of magnetron sputtering or thermal evaporation, for example, and a pattern including the gate line 11, the first gate 102 and the second gate 202 is formed through a patterning process using a common mask, wherein the first gate 102 is connected to the gate line 11, the second gate 202 is separated from the first gate 102, as shown in FIGS. 8 and 9.

Figure 10:
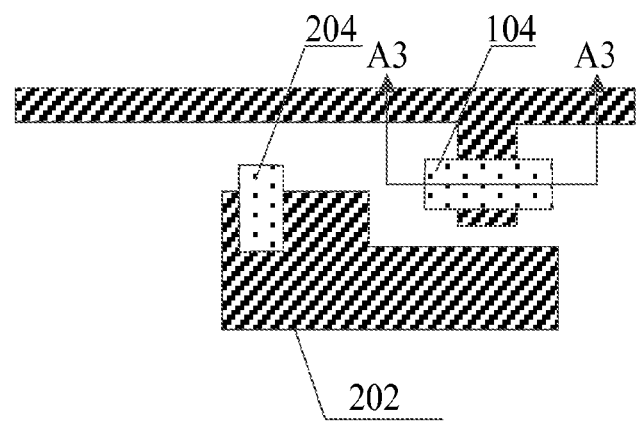
FIG. 10 is a plan view of the array substrate subjected to the second process according to the third embodiment of the present invention.
Figure 10:
Figure 11:
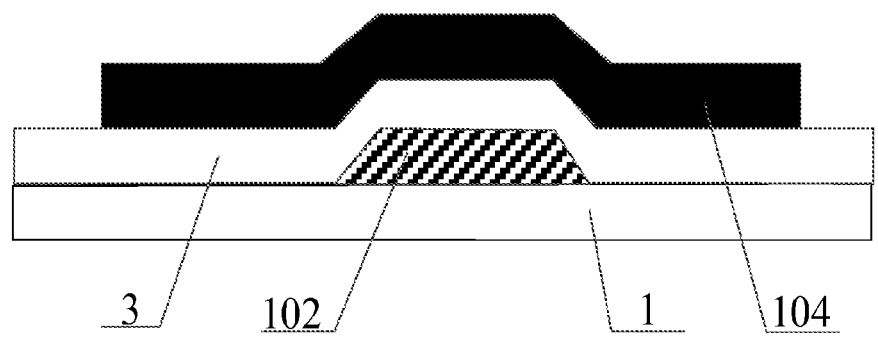
FIG. 11 is a cross-sectional diagram viewed along line A3-A3 in FIG. 10.

FIG. 10 is a plan view of the array substrate subjected to the second process according to the third embodiment of the present invention, which illustrates an intermediate structure of the pixel unit, and FIG. 11 is a cross-sectional diagram viewed along line A3-A3 in FIG. 10. On the substrate having the above pattern in FIG. 8, a gate insulation layer film is first coated by way of spin coating. On the substrate coated with the above gate insulation layer film, the gate insulation layer 3 is formed, then an oxide active layer film is deposited by way of plasma enhanced chemical vapor deposition (PECVD), and a pattern including the first oxide active layer 104 and the second oxide active layer 204 is formed through a patterning process using a common mask.

Figure 12:
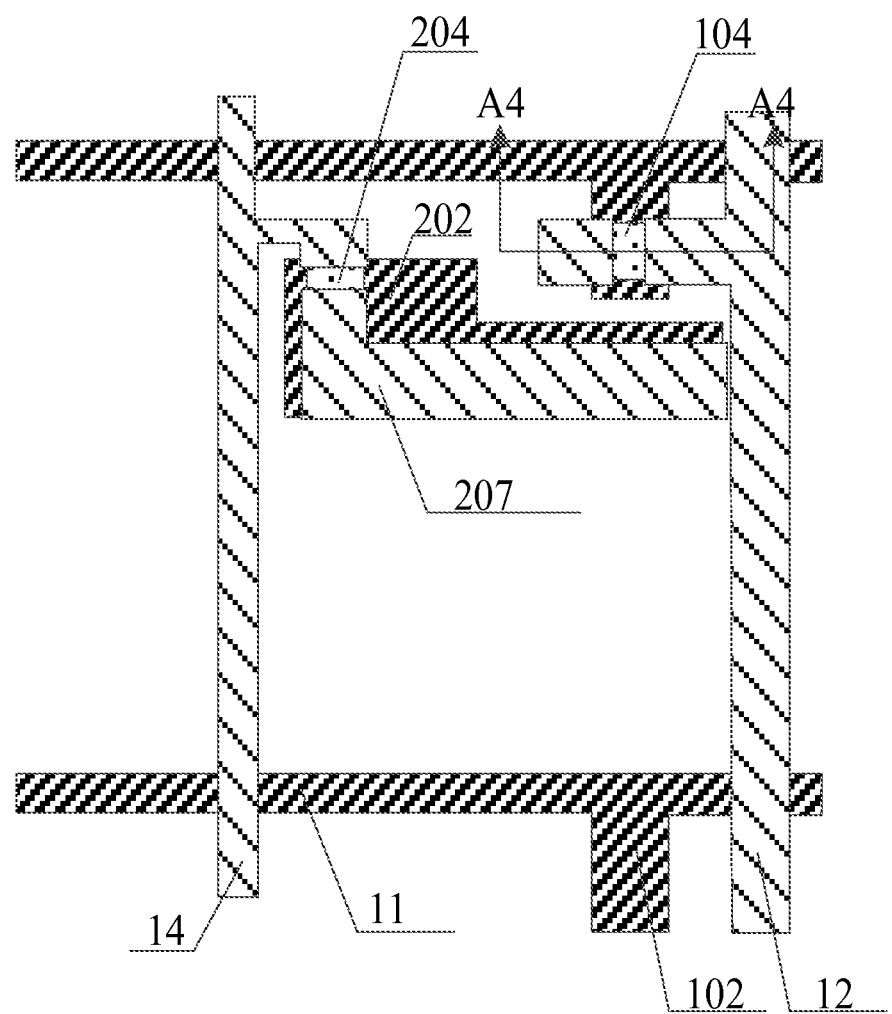
FIG. 12 is a plan view of the array substrate subjected to the third process according to the third embodiment of the present invention.
Figure 13:
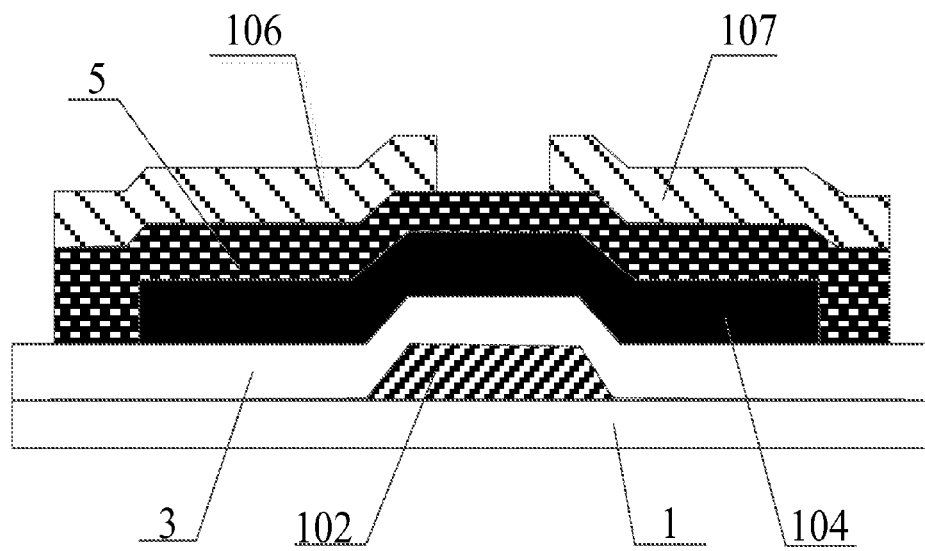
FIG. 13 is a cross-sectional diagram viewed along line A4-A4 in FIG. 12.
Figure 14:
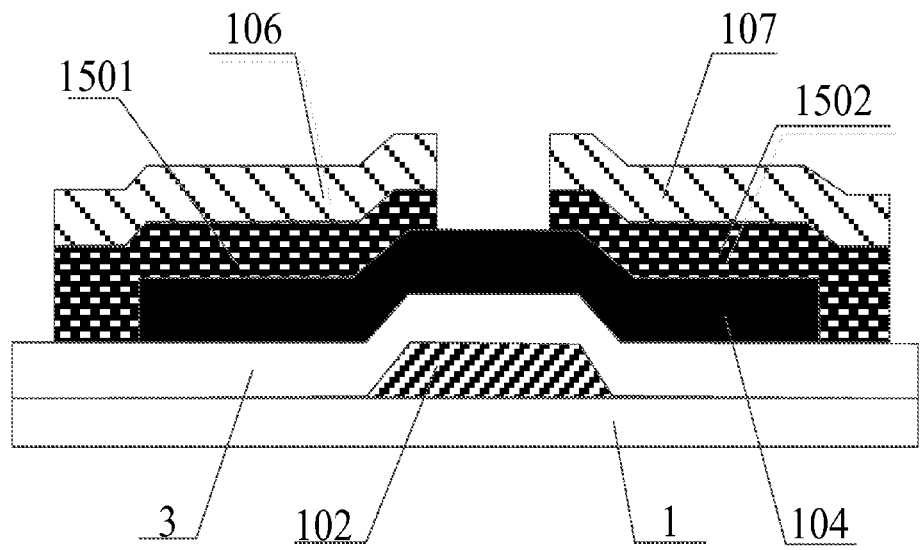
FIG. 14 is another cross-sectional diagram viewed along line A4-A4 in FIG. 12.

FIG. 12 is a plan view of the array substrate subjected to the third processing according to the third embodiment of the present invention, which illustrates an intermediate structure of the pixel unit, and FIGS. 13 and 14 are cross-sectional diagrams viewed along line A4-A4 in FIG. 12. On the substrate having the above pattern in FIG. 10, a source and drain transition layer film is first deposited, then a source and drain metal film is deposited by way of, for example, magnetron sputtering or thermal evaporation, and a pattern including the data line 12, the first source 106, the first drain 107, the second source 206, the second drain 207, the first TFT active region and the second TFT active region is formed through a patterning process using a common mask, as shown in FIG. 13.

In FIG. 13, the first oxide active layer 104 is formed on the gate insulation layer 3 and above the first gate 102, the second oxide active layer 204 is formed on the gate insulation layer 3 and above the second gate 202; the first source and drain transition layer and the second source and drain transition layer are formed on the gate insulation layer 3. In this patterning process, the first source 106 and the first drain 107 are formed on the first source and drain transition layer, and the second source 206 and the second drain 207 are formed on the second source and drain transition layer; one end of the first source 106 is located above the first gate 102, and the other end is connected to the data line 12; one end of the first drain 107 is located above the first gate 102, being opposite to the first source 106, and the other end will be connected to the pixel electrode through the first via hole 110 in the next patterning process, so as to be connected to the second gate 202.

As shown in FIG. 13, in this embodiment, the source and drain metal film is wet etched to form the first source 106 and the first drain 107, and the second source 206 and the second drain 207, and then as shown in FIG. 14, the first source and drain transition layer and the second source and drain transition layer are etched using dry etching, such that the first source and drain transition layer and the second source and drain transition layer are respectively etched at the middle portion to form the first source transition layer 1501, the first drain transition layer 1502, and the second source transition layer 2501, the second drain transition layer 2502. It should be noted that the gap (space) between the source transition layer and the drain transition layer may have the same shape as the gap (space) between the source and the drain, or may also have a different shape, however, the source transition layer and the drain transition layer may not be connected, and have to be separated from each other, the width of the gap may be adjusted through controlling speed of gas flow in the dry etching and etching duration. The source and drain transition layers are provided to prevent the oxide active layer from being corroded by etchant of the wet etching when performing wet etching on the source and drain metal film; however, as material of the source and drain transition layer film is a heavily doped semiconductor material including at least one element from B, Si, Ge and Te, the source and drain transition layer has good electric conductivity, and when it was disposed under the source and the drain, the source and the drain can be electrically connected, such that the TFT loses the function of controlling every independent pixel. Therefore, it is required to provide a gap between the source transition layer and the drain transition layer, such that the source transition layer and the drain transition layer are not connected. As shown in FIG. 14, the portion of the first oxide active layer 104 corresponding to the gap between the first source 106 and the first drain 107 forms the first TFT active region, and meanwhile, the portion of the second oxide active layer 204 corresponding to the gap between the second source 206 and the second drain 207 forms the second TFT active region Hereafter, an annealing treatment is performed on the substrate subjected to the above processing in an atmosphere of $O_2$ or air, such that the active regions of the first oxide active layer 104 and the second oxide active layer 204 keep good semiconductor characteristics, while regions where the first oxide active layer 104 contacts the first source and drain transition layers (i.e., a first source contact region and a first drain contact region), and regions where the second oxide active layer 204 contacts the second source and drain transition layers (i.e., a second source contact region and a second drain contact region) represent conductor characteristics. As $H^+$ in the first source transition layer 1501 and the first drain transition layer 1502, and $H^+$ in the second source transition layer 2501 and the second drain transition layer 2502 penetrate into the first oxide active layer 104 and the second oxide active layer 204, respectively, the first source contact region and the first drain contact region of the first oxide active layer 104, and the second source contact region and the second drain contact region of the second oxide active layer 204 are converted into conductors. For example, when In—Ga—Zn-Oxide (IGZO) is used as the oxide active layer, annealing is performed under a condition with an $O_2$ pressure in the range of $0.5 \times 10^5$ Pa-$1.2 \times 10^5$ Pa, a temperature in the range of 200-300° C. and an annealing time in the range of 60-90 Min. After annealing, the resistivity of the active region of the oxide active layer is larger than $10^6$ Ω·cm, representing semiconductor characteristics, and the resistivity of the source contact region and the drain contact region of the oxide active layer is smaller than $1 \times 10^{-3}$ Ω·cm, representing conductor characteristics. Wherein, thickness of the source transition layers and the drain transition layers is in the range of 10 nm-1000 nm; the material of the source transition layers and the drain transition layers is a heavily doped semiconductor material including at least one element from B, Si, Ge and Te.

Figure 15:
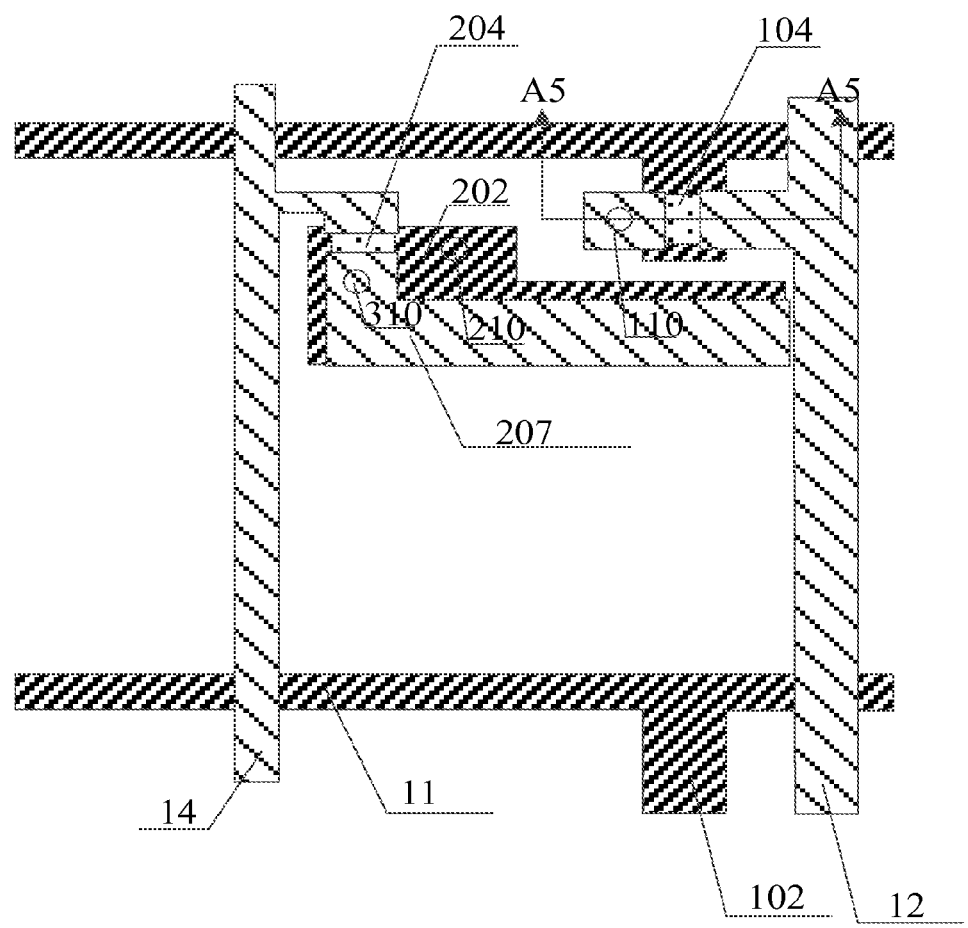
FIG. 15 is a plan view of the array substrate subjected to the fourth process according to the third embodiment of the present invention.
Figure 16:
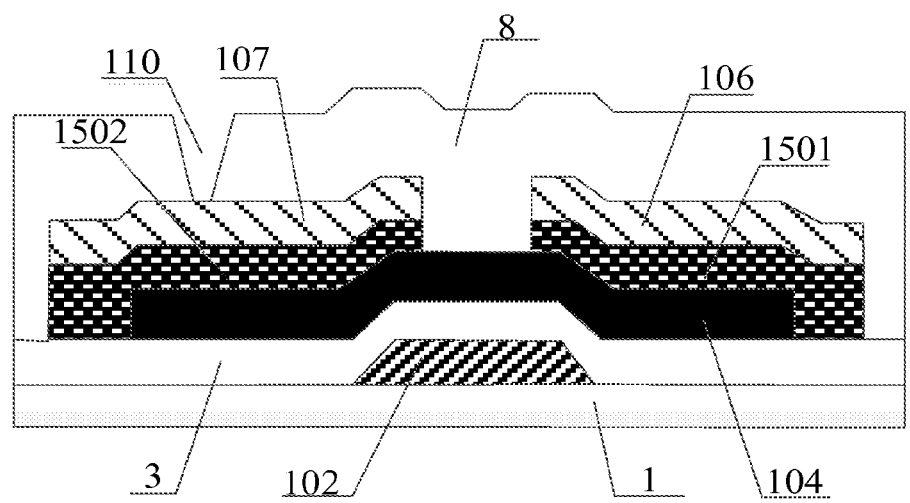
FIG. 16 is a cross-sectional diagram viewed along line A5-A5 in FIG. 15.

FIG. 15 is a plan view of the array substrate subjected to the fourth process according to the third embodiment of the present invention, which illustrates an intermediate structure of the pixel unit, and FIG. 16 is a cross-sectional diagram viewed along line A5-A5 in FIG. 15. On the substrate having the above pattern in FIG. 12, a passivation layer film is deposited by way of, for example, PECVD, and the passivation layer 8, and the first via hole 110, the second via hole 210 and the third via hole 310 provided in the passivation layer 8 are formed through a patterning process using a common mask, wherein the first via hole 110 is provided at a position where the first drain 107 is located, passes through the passivation layer 8, and the surface of the first drain 107 is exposed by the first via hole 110, as shown in FIGS. 15 and 16; the second via hole 210 is provided at a position where the second gate 202 is located, passes through the passivation layer 8, and the surface of the second gate 202 is exposed by the second via hole 210, as shown in FIG. 15; the third via hole 310 is provided at a position where the second drain 207 is located, passes through the passivation layer 8, and the surface of the second drain 207 is exposed by the third via hole 310, as shown in FIG. 15.

Referring to FIG. 6 again, the first pixel electrode 109 is formed on the passivation layer 8, only partially covers the first drain 107 and the second gate 202, and is connected to the first drain 107 and the second gate 202 through the first via hole 110 and the second via hole 210, respectively, and the first pixel electrode 109 connects the first drain 107 with the second gate 202; at the same time, the second pixel electrode 209 is formed on the passivation layer 8, covers the whole display region and a part of the second drain 207, and is connected to the second drain 207 through the third via hole 310. In the course of forming the pattern of via holes 110, 210 and 310 in the passivation layer, at the same time, a pattern of a gate line interface via hole is formed at a gate line interface region and a pattern of a data line interface via hole is formed at a data line interface region, as structures and forming procedures of the patterns of the gate line interface via hole and the data line interface via hole have been widely used in the current patterning process, it will not be described in detail here.

At last, on the substrate having the pattern in FIG. 15, a transparent conductive film is deposited by way of magnetron sputtering or thermal evaporation, for example, and a pattern including the first pixel electrode 109 and the second pixel electrode 209 is formed through a patterning process using a common mask, such that the first pixel electrode 109 is within the pixel region, only partially covers the first drain 107 and the second gate 202, and is connected to the first drain 107 and the second gate 202 through the first via hole 110 and the second via hole 210, respectively; the second pixel electrode 209 is within the pixel region, is connected to the second drain 207 through the third via hole 310 in the passivation layer 8, and meanwhile forms a storage capacitor with the second gate 202, as shown in FIG. 6.

It should be noted that the above embodiment is only a structure of an AMOLED array substrate of the third embodiment of the present invention. In a practical application, a similar structure can be formed by changing material or adjusting processing flow.

The structure described in the embodiments of the present invention is a back channel etch type bottom-gate structure or a back channel etch type top-gate structure, however, the TFT may be of various structures, such as a back channel protected type structure, a normal staggered structure, or an inverted staggered structure, and therefore, order of arrangement of respective film layers of a TFT and an array substrate may have many variations, for example, the gate 2 and the common electrode 13 may not be directly disposed on the substrate, and there may be other film layer disposed there between. The insulation layer on the gate 2 does not have to be one layer, and there may be more than one transition layer between the source and drain transition layer and the source 6.

In the structures of the embodiments of the present invention, it is enough to ensure that a source and drain transition layer is provided between the source and drain metal layer and the oxide active layer. In addition, the array substrates described in the present invention are only described by taking bottom-gate type structures as examples, however, the technical solutions mentioned in the present invention also apply to top-gate type structures, which include a structure formed by forming a source and a drain on a substrate, and then sequentially forming a source and drain transition layer, an oxide active layer, a gate insulation layer and a gate on the source and the drain; and also include a structure formed by forming an oxide active layer on a substrate, and then sequentially forming a source and drain transition layer, a source and a drain, a gate insulation layer and a gate on the oxide active layer. Common points between the top-bottom type and bottom-gate type array substrates are functions achieved by the source and drain transition layer and the arrangement that the source and drain transition layer and the oxide active layer are in direct contact with each other. Therefore, annealing treatment under the specific condition can also be used in the fabrication methods to make the oxide active layer become two conductor regions and a semiconductor region. As such, the two top-gate type structures described above and fabrication methods thereof are not elaborated herein.

Figure 17:
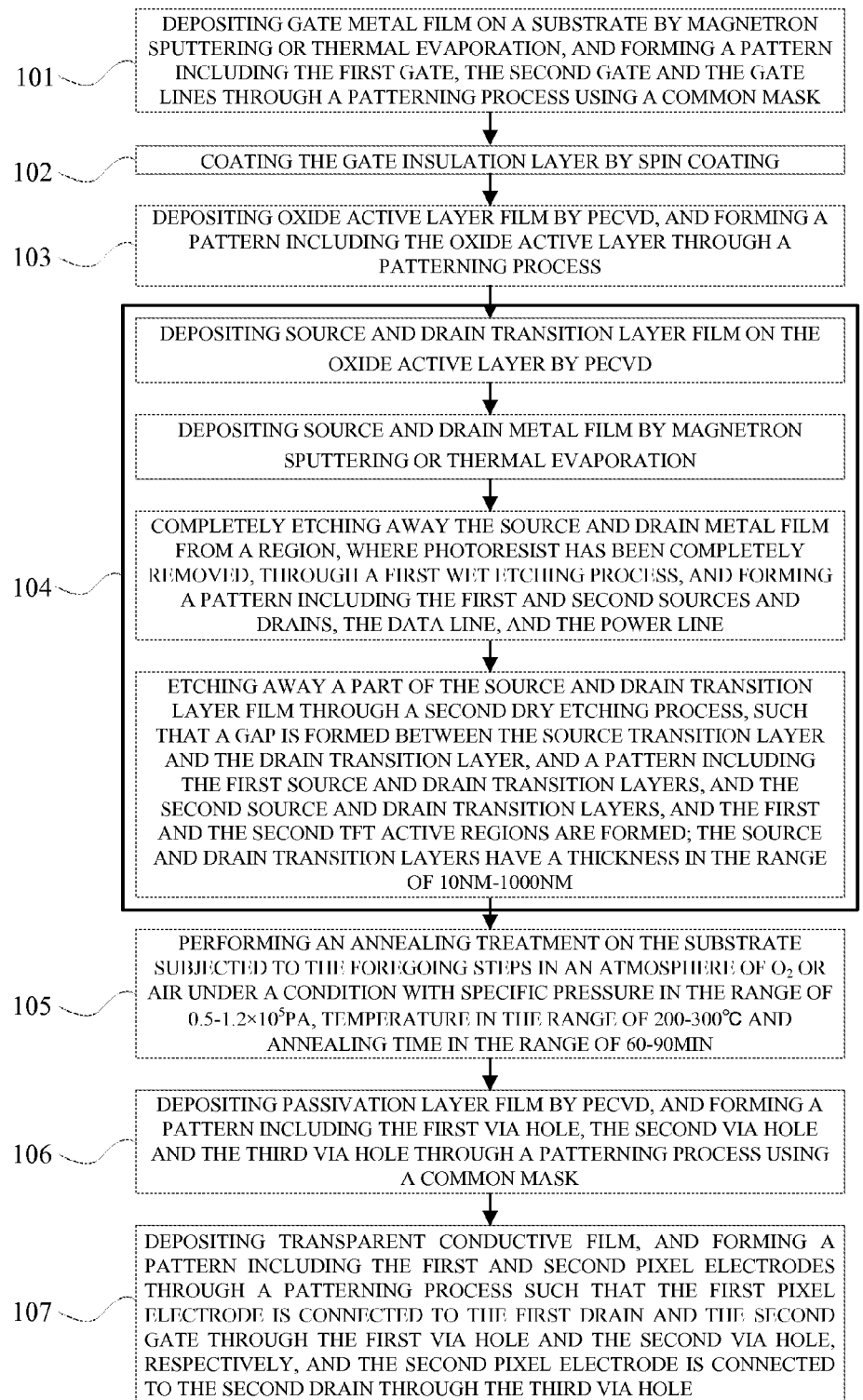
FIG. 17 is a flow chart of a fabrication method of the array substrate according to the third embodiment of the present invention.

FIG. 17 is a flow chart of a fabrication method of the array substrate according to the third embodiment of the present invention, which includes:

Step 101: depositing a gate metal film on a substrate by way of magnetron sputtering or thermal evaporation, and forming a pattern including the first gate, the second gate and the gate line through a patterning process using a common mask;

Step 102: coating a gate insulation layer by way of spin coating;

Step 103: depositing an oxide active layer film by way of plasma enhanced chemical vapor deposition, and forming a pattern including the oxide active layer through a patterning process;

Step 104: depositing a source and drain transition layer film on the oxide active layer by way of plasma enhanced chemical vapor deposition; depositing a source and drain metal film by way of magnetron sputtering or thermal evaporation; coating a layer of photoresist on the source and drain metal film, and performing a patterning process on the photoresist; completely removing the source and drain metal film in a region, where the photoresist has been completely removed, through a first wet etching process, to form a pattern including the first source and drain, the second source and drain, the data line, and the power line;

Hereafter, etching away part of the source and drain transition layer through a second dry etching process such that a gap is formed between a source transition layer and a drain transition layer, and a pattern including the first source and drain transition layers, the second source and drain transition layers and the first and the second active regions is formed; the first and the second source transition layers and the first and the second drain transition layers have thickness in the range of 10 nm-1000 nm;

Step 105: performing an annealing treatment on the substrate subjected to the foregoing steps in an atmosphere of $O_2$ or air under a condition with a specific pressure in the range of $0.5 \times 10^5$ Pa-$1.2 \times 10^5$ Pa, a temperature in the range of 200-300° C. and an annealing time in the range of 60-90 Min;

Step 106: depositing a passivation layer film by way of plasma enhanced chemical vapor deposition, and forming a pattern including the first via hole, the second via hole and the third via hole through a patterning process using a common mask, wherein the first via hole is located at a position where the first drain is positioned, and passes through the passivation layer to reach the first drain; the second via hole is located at a position where the second gate is positioned, and passes through the passivation layer and the gate insulation layer to reach the second gate; the third via hole is located at a position where the second drain is positioned, and passes through the passivation layer to reach the second drain; and Step 107: depositing a transparent conductive film, and forming a pattern including the first pixel electrode and the second electrode through a patterning process, such that the first pixel electrode is connected to the first drain and the second gate through the first via hole and the second via hole, respectively, and the second pixel electrode is connected to the second drain through the third via hole.

This embodiment is a technical solution in which a source and drain transition layer is formed between the source and drain layer and the oxide active layer while the etch stop layer in the prior art is omitted, its fabrication procedure has been described in details in the above technical solution shown in FIGS. 8-16, and is not elaborated herein.

Above embodiments of the present invention provide an array substrate and a fabrication method thereof, which may effectively reduce one mask process. The oxide TFT technique without an etch stop layer can effectively simplify fabrication process of the oxide TFT and improve stability of the oxide TFT. It should be known by the person skilled in the art that, structures and fabrication methods of the oxide TFTs in the above embodiments also apply to array substrates with other modes or other structures, for example, may apply to a traditional twisted nematic (TN) display mode, FIG. 4 is a cross-sectional diagram of a typical TN mode array substrate, its section line is similar to the direction A0-A0 in FIG. 1, and a TN mode array substrate differs from an OLED substrate only in that there is no power line, the second TFT, or the second pixel electrode; and structures and fabrication methods of the oxide TFTs in the above embodiments may also apply to a ADS display mode array substrate, which differs from a TN mode array substrate only in arrangement of the common electrode and the pixel electrode, and the TFT of which is the same as that of a TN mode array substrate, and is not elaborated herein. As long as an oxide TFT described in the embodiments of the present invention is included in an array substrate, such an array substrate is within the protection scope of the present invention.

The present invention also provides a display device, which includes any one of the above array substrates, and the display device may be a liquid crystal panel, a liquid crystal television, a liquid crystal display, an OLED panel, an OLED television, e-paper, a digital photo frame, a cell phone, or the like.

The fabrication method of a TFT and the fabrication method of an array substrate of the present invention omit the etch stop layer, reduce one patterning process and save one mask process by additionally providing the source and drain transition layer between the source, the drain and the oxide active layer, thus effectively simplifying the fabrication process. At the same time, the additionally provided source and drain transition layer may prevent the oxide active layer from being corroded during etching, also effectively reduce threshold voltage ($V_{th}$) drift of the TFT, improve $I_{on}$ (on-state current)/$I_{off}$ (off-state current), and enhance thermal stability. The present invention has simple technical means, is easy to implement and has a broad application prospect.

It should be noted at last, the above embodiments are only used to describe but not to limit the technical solutions of the present invention, although the present invention has been described in details with reference to the embodiments, and the person skill in the art should understand that modifications or equivalent replacements can be made to the technical solutions of the present invention without departing from the spirit and scope of the present invention.

What is claimed is:

1. A thin film transistor, including a gate, a gate insulation layer, an oxide active layer, a source, and a drain, wherein a region of the oxide active layer corresponding to a gap between the source and the drain is an active region, wherein the thin film transistor further includes: a source transition layer formed between the source and the oxide active layer, and a drain transition layer formed between the drain and the oxide active layer, wherein the source transition layer and the drain transition layer comprise a heavily doped semiconductor material, wherein the source transition layer is formed on the oxide active layer, and the source is formed on the source transition layer; the drain transition layer is formed on the oxide active layer, and the drain is formed on the drain transition layer; the source transition layer and the drain transition layer are not connected; and both the source transition layer and the drain transition layer are in direct contact with the oxide active layer, wherein the oxide active layer of the thin film transistor includes the active region, a source contact region and a drain contact region, wherein the active region represents semiconductor characteristics, and wherein the source contact region and the drain contact region represent conductor characteristics, wherein the source transition layer is provided on the source contact region of the oxide active layer, and the drain transition layer is provided on the drain contact region of the oxide active layer; and wherein the source contact region includes hydrogen ions that penetrate into the oxide active layer from the source transition layer, and the drain contact region includes hydrogen ions that penetrate into the oxide active layer from the drain transition layer.

2. The thin film transistor of claim 1, wherein the source transition layer has the same pattern as the source, and the drain transition layer has the same pattern as the drain.

3. The thin film transistor of claim 1, wherein the source transition layer and the drain transition layer extend towards the active region relative to positions of the source and the drain, and partially cover the active region.

4. The thin film transistor of claim 1, wherein the source transition layer and the drain transition layer have thickness in the range of 10 nm-1000 nm.

5. The thin film transistor of claim 1, wherein material of the source transition layer and the drain transition layer is a heavily doped semiconductor material including at least one element from B, Si, Ge and Te.

6. The thin film transistor of claim 1, wherein the active region of the oxide active layer has a resistivity larger than $10^6$ $\Omega \cdot cm \sim 10^9$ $\Omega \cdot cm$, the source contact region and the drain contact region of the oxide active layer have a resistivity smaller than $1 \times 10^{-3}$ $\Omega \cdot cm$.

7. The thin film transistor of claim 1, wherein the source transition layer, the drain transition layer, the source and the drain are formed in a single patterning process.

8. The thin film transistor of claim 1, wherein the gate is formed on a substrate, the gate insulation layer is formed on the gate, and the oxide active layer is formed on the gate insulation layer.

9. The thin film transistor of claim 1, wherein the oxide active layer is formed on a substrate, the gate insulation layer is formed on the source and the drain, and the gate is formed on the gate insulation layer.

10. An array substrate, including a gate line, a data line, a pixel electrode, a thin film transistor, a passivation layer and a via hole in the passivation layer, wherein the thin film transistor includes a gate, a gate insulation layer, an oxide active layer, a source, and a drain, wherein a region of the oxide active layer corresponding to a space between the source and the drain is an active region, wherein the thin film transistor further includes: a source transition layer between the source and the oxide active layer, and a drain transition layer between the drain and the oxide active layer, the source transition layer and the drain transition layer comprising a heavily doped semiconductor material, wherein the source transition layer is formed on the oxide active layer, and the source is formed on the source transition layer; the drain transition layer is formed on the oxide active layer, and the drain is formed on the drain transition layer; the source transition layer and the drain transition layer are not connected; and both the source transition layer and the drain transition layer are in direct contact with the oxide active layer, wherein the oxide active layer of the thin film transistor includes the active region, a source contact region and a drain contact region, wherein the active region represents semiconductor characteristics, and the source contact region and the drain contact regions represent conductor characteristics, wherein the source transition layer is provided on the source contact region of the oxide active layer, and the drain transition layer is provided on the drain contact region of the oxide active layer, and wherein the source contact includes hydrogen ions that penetrate into the oxide active layer from the source transition layer, and the drain contact region includes hydrogen ions that penetrate into the oxide active layer from the drain transition layer.

11. The array substrate of claim 10, wherein material of the source transition layer and the drain transition layer is a heavily doped semiconductor material including at least one element from B, Si, Ge and Te.

12. The array substrate of claim 10, wherein the gate line and the gate are formed on a substrate, the gate insulation layer is formed on the gate line and the gate, the oxide active layer is formed on the gate insulation layer, and the passivation layer and the pixel electrode are sequentially formed on the source and the drain.

13. The array substrate of claim 10, wherein the oxide active layer is formed on a substrate, the gate insulation layer is formed on the source and the drain, and the gate and the pixel electrode are formed on the gate insulation layer.

14. The array substrate of claim 10, including a first thin film transistor and a second thin film transistor, wherein the gate line, a first gate and a second gate are formed on a substrate; the first gate and the second gate are not in contact; and the gate insulation layer is formed on the gate line, the first gate and the second gate, wherein a first oxide active layer is formed on the gate insulation layer of the first gate, a second oxide active layer is formed on the gate insulation layer of the second gate, a first source transition layer and a first drain transition layer are formed on the first oxide active layer, a second source transition layer and a second drain transition layer are formed on the second oxide active layer, a first source and a first drain are respectively formed on the first source transition layer and the first drain transition layer, a second source and a second drain are respectively formed on the second source transition layer and the second drain transition layer; the passivation layer and a first via hole, a second via hole and a third via hole in the passivation layer are formed on the first source, the first drain, the second source and the second drain to cover the substrate; and wherein a pattern including a first pixel electrode and a second pixel electrode is formed on the passivation layer such that the first pixel electrode is connected to the first drain and the second gate through the first via hole and the second via hole, respectively, and the second pixel electrode is connected to the second drain through the third via hole.

15. A fabrication method of a thin film transistor, the thin film transistor including a gate, a gate insulation layer, an oxide active layer, a source and a drain, wherein a region of the oxide active layer corresponding to a space between the source and the drain is an active region, wherein the method includes:
forming a transition layer film comprising a heavily doped semiconductor material on the oxide active layer;
forming a metal film on the transition layer film; and
forming the source, the drain, the source transition layer and the drain transition layer through a patterning process,
wherein the source transition layer is formed between the source and the oxide active layer; the drain transition layer is formed between the drain and the oxide active layer; the source transition layer and the drain transition layer are not connected; and both the source transition layer and the drain transition layer are in direct contact with the oxide active layer,
wherein the oxide active layer of the thin film transistor includes the active region, a source contact region and a drain contact region, wherein the active region represents semiconductor characteristics, and wherein the source contact region and the drain contact region represent conductor characteristics,
wherein the source transition layer is formed on the source contact region of the oxide active layer, and the drain transition layer is formed on the drain contact region of the oxide active layer, and
wherein the method further includes performing an annealing treatment in an atmosphere of $O_2$ or air so that hydrogen ions in the source transition layer and the drain transition layer penetrate into the oxide active layer to convert the source contact region and the drain contact region into the conductors, respectively.

16. The fabrication method of claim 15, further including:
an operation 1: depositing a gate metal film on a substrate, and forming a pattern including the gate through a patterning process;
an operation 2: forming the gate insulation layer on the substrate subjected to the foregoing operation;
an operation 3: forming an oxide active layer film on the substrate subjected to the foregoing operations, and forming a pattern including the oxide active layer through a patterning process;
an operation 4: depositing a source and drain transition layer film on the substrate subjected to the foregoing operations, then depositing a source and drain metal film on the source and drain transition layer film, and forming a pattern including the source, the drain, the source transition layer, the drain transition layer and the active region through a single patterning process, wherein the source transition layer and the drain transition layer have thickness in the range of 10 nm-1000 nm; and
an operation 5: performing the annealing treatment on the substrate subjected to the foregoing operations in an atmosphere of O2 or air under a condition with a specific pressure in the range of 0.5×105 Pa-1.2×105 Pa, a temperature in the range of 200-300° C. and an annealing time in the range of 60-90 Min.

17. The fabrication method of claim 15, further including:
an operation 1: depositing an oxide active layer film on a substrate, and forming a pattern including the oxide active layer through a patterning process;
an operation 2: depositing a source and drain transition layer film on the substrate subjected to the foregoing operation;
an operation 3: depositing a source and drain metal film on the substrate subjected to the foregoing operations, and forming a pattern including the source, the drain, the source transition layer, the drain transition layer and the active region through a single patterning process, wherein, the source transition layer and the drain transition layer have thickness in the range of 10 nm-1000 nm;
an operation 4: performing the annealing treatment on the substrate subjected to the foregoing operations in an atmosphere of O2 or air under a condition with a specific pressure in the range of 0.5×105 Pa-1.2×105 Pa, a temperature in the range of 200-300° C. and an annealing time in the range of 60-90 Min;
an operation 5: forming the gate insulation layer on the substrate subjected to the foregoing operations; and
an operation 6: depositing a gate metal film on the substrate subjected to the foregoing operations, and forming a pattern including the gate through a patterning process.

18. The fabrication method of claim 15, wherein material of the source transition layer and the drain transition layer is a heavily doped semiconductor material including at least one element from B, Si, Ge and Te.

19. A display device, including an array substrate including a gate line, a data line, a pixel electrode, a thin film transistor, a passivation layer and a via hole in the passivation layer,
wherein the thin film transistor includes a gate, a gate insulation layer, an oxide active layer, a source, and a drain, wherein a region of the oxide active layer corresponding to a space between the source and the drain is an active region,
wherein the thin film transistor further includes: a source transition layer between the source and the oxide active layer, and a drain transition layer between the drain and the oxide active layer, the source transition layer and the drain transition layer comprising a heavily doped semiconductor material,
wherein the source transition layer is formed on the oxide active layer, and the source is formed on the source transition layer; the drain transition layer is formed on the oxide active layer, and the drain is formed on the drain transition layer; the source transition layer and the drain transition layer are not connected; and both the source transition layer and the drain transition layer are in direct contact with the oxide active layer,
wherein the oxide active layer of the thin film transistor includes the active region, a source contact region and a drain contact region, wherein the active region represents semiconductor characteristics, and the source contact region and the drain contact regions represent conductor characteristics,
wherein the source transition layer is provided on the source contact region of the oxide active layer, and the drain transition layer is provided on the drain contact region of the oxide active layer, and
wherein the source contact region includes hydrogen ions that penetrate into the oxide active layer from the source transition layer, and the drain contact region includes hydrogen ions that penetrate into the oxide active layer from the drain transition layer.

* * * * *